(12) United States Patent
Arikan

(10) Patent No.: US 11,405,055 B2
(45) Date of Patent: Aug. 2, 2022

(54) METHODS AND APPARATUS FOR ERROR CORRECTION CODING WITH TRIANGULAR FACTORIZATION OF GENERATOR MATRIX

(71) Applicant: Polaran Haberlesme Teknolojileri Anonim Sirketi, Ankara (TR)

(72) Inventor: Erdal Arikan, Ankara (TR)

(73) Assignee: Polaran Haberlesme Teknolojileri Anonim Sirketi, Cankaya/Ankara (TR)

( * ) Notice: Subject to any disclaimer, the term of this patent is extended or adjusted under 35 U.S.C. 154(b) by 0 days.

(21) Appl. No.: 16/453,887

(22) Filed: Jun. 26, 2019

(65) Prior Publication Data
US 2020/0412385 A1 Dec. 31, 2020

(51) Int. Cl.
*H03M 13/29* (2006.01)
*H03M 13/13* (2006.01)
*H03M 13/00* (2006.01)

(52) U.S. Cl.
CPC ....... *H03M 13/2906* (2013.01); *H03M 13/13* (2013.01); *H03M 13/616* (2013.01)

(58) Field of Classification Search
CPC . H03M 13/2906; H03M 13/13; H03M 13/616
(Continued)

(56) References Cited

U.S. PATENT DOCUMENTS

2014/0208183 A1* 7/2014 Mahdavifar ........ H03M 13/296
714/755
2018/0167369 A1* 6/2018 Shapira ............. H04W 12/1202
(Continued)

FOREIGN PATENT DOCUMENTS

WO 2018/060961 A1 4/2018
WO 2018/196765 A1 11/2018

OTHER PUBLICATIONS

Wang et al., "Concatenations of Polar Codes with Outer BCH Codes and Convolutional Codes", Fifty-second Annual Allerton Conference, Oct. 1-3, 2014, 7 pages.
(Continued)

Primary Examiner — James C Kerveros

(57) ABSTRACT

An encoder apparatus for reliable transfer of a source data block d in a communication system includes an outer transform configured to receive a data container block v and compute an outer transform block u, whereby $u = vG_{out}$ for an outer transform matrix $G_{out}$. The encoder apparatus also includes an inner transform configured to receive the outer transform block u and compute a transmitted code block x, whereby $x = uG_{in}$ for an inner transform matrix $G_{in}$. The data container block v is obtained from the source data block d and a frozen data block a. The frozen data block a is a predetermined block of symbols. The outer transform matrix $G_{out}$ and the inner transform matrix form a triangular factorization of a transform matrix G, which optionally is a non-triangular matrix, while the outer transform matrix $G_{out}$ and the inner transform matrix $G_{in}$ are strictly upper- and lower-triangular matrices, respectively.

12 Claims, 12 Drawing Sheets

(58) Field of Classification Search
USPC .......................................................... 714/755
See application file for complete search history.

(56) References Cited

U.S. PATENT DOCUMENTS

| | | | |
|---|---|---|---|
| 2019/0158226 A1* | 5/2019 | Hui | H03M 13/2906 |
| 2019/0253213 A1* | 8/2019 | Garlapati | H04L 1/0057 |
| 2020/0059245 A1 | 2/2020 | Zhang et al. | |
| 2020/0212936 A1* | 7/2020 | Maunder | H03M 13/13 |

OTHER PUBLICATIONS

Hall, "Chapter 3 Linear Codes", Jan. 1, 2015, 17 pages.
"Strictly Upper Triangular Matrix", Wolfram Mathworld, Oct. 29, 2020, 1 page.
Trifonov et al., "Polar Subcodes", Oct. 15, 2018, 27 pages.
Yuan et al., "Polar Code Construction for List Decoding", Jul. 31, 2017, 6 pages.
Rowshan et al. ."Polarization-adjusted Convolutional (PAC) Codes: Fano Decoding vs List Decoding", Feb. 17, 2020, 13 pages.
International Search Report dated Nov. 11, 2020 in connection with International Patent Application No. PCT/IB2020/055588, 7 pages.
Written Opinion of the International Searching Authority dated Nov. 11, 2020 in connection with International Patent Application No. PCT/IB2020/055588, 20 pages.
Invitation to Restrict or Pay Additional Fees, and, Whereapplicable, Protest Fee dated Jul. 12, 2021 in connection with International Patent Application No. PCT/IB2020/055588, 3 pages.
Written Opinion of the International Preliminary Examining Authority dated Sep. 7, 2021 in connection with International Patent Application No. PCT/IB2020/055588, 9 pages.
"5G; NR; Multiplexing and channel coding (3GPP TS 38.212 version 15.2.0 Release 15)", ETSI TS 138 212, Jul. 2018, 101 pages.
E. Arikan, "Channel combining and splitting for cutoff rate improvement," IEEE Transactions on Information Theory, vol. 52, No. 2, pp. 628-639, Feb. 2006.
E. Arikan, "A Performance Comparison of Polar Codes and Reed-Muller Codes," IEEE Communications Letters, vol. 12, No. 6, pp. 447-449, Jun. 2008.
E. Arikan, "Channel Polarization: A Method for Constructing Capacity-Achieving Codes for Symmetric Binary-Input Memoryless Channels," IEEE Transactions on Information Theory, vol. 55, No. 7, pp. 3051-3073, Jul. 2009.
E. Arikan and E. Telatar, "On the rate of channel polarization," IEEE International Symposium on Information Theory, 2009. ISIT 2009, Jun.-Jul. 2009, pp. 1493-1495.
E. Arikan, H. Kim, G. Markarian, U. Ozgur, and E. Poyraz, "Performance of short polar codes under ML decoding," Proc. ICT-Mobile Summit 2009, Jun. 2009, 6 pages.
E. Arikan and G. Markarian, "Two-dimensional polar coding," Proc. Tenth International Symposium on Coding Theory and Applications (ISCTA'09), Jul. 2009, 3 pages.
E. Arikan, "On the Origin of Polar Coding," IEEE Journal on Selected Areas in Communications, vol. 34, No. 2, pp. 209-223, Feb. 2016.
M. Bakshi, S. Jaggi, and M. Effros, "Concatenated Polar Codes," 2010 IEEE International Symposium on Information Theory Proceedings (ISIT), Jun. 2010, pp. 918-922.
V. Bioglio, C. Condo, and I. Land, "Design of Polar Codes in 5G New Radio," arXiv:1804.04389 [cs, math], Apr. 2018, 11 pages.
Blokh, E. L. and Zyablov, V. V., "Coding of Generalized Concatenated Codes," Problems of Information Transmission, vol. 10, No. 3, pp. 218-222, 1974. (English abstract only).
J. Chen, Y. Chen, K. Jayasinghe, D. Du, and J. Tan, "Distributing CRC Bits to Aid Polar Decoding," 2017 IEEE Globecom Workshops (GC Wkshps), Dec. 2017, 6 pages.
P. Elias, "Error-free Coding," Transactions of the IRE Professional Group on Information Theory, vol. 4, No. 4, pp. 29-37, Sep. 1954.
R. Fano, "A heuristic discussion of probabilistic decoding," IEEE Transactions on Information Theory, vol. 9, No. 2, p. 64-74, Apr. 1963.
A. J. Ferris, C. Hirche, and D. Poulin, "Convolutional Polar Codes," arXiv:1704.00715 [cs, math], Apr. 2017, 25 pages.
G. D. Forney, Jr, "Concatenated Codes", Technical Report 440, Massachusetts Institute of Technology Research Laboratory of Electronics, Dec. 1965, 116 pages.
Huawei, HiSilicon, "Details of the Polar code design", 3GPP TSG RAN WG1 Meeting #87, R1-1611254, Nov. 2016, 15 pages.
H. Imai and S. Hirakawa, "A new multilevel coding method using error-correcting codes," IEEE Transactions on Information Theory, vol. 23, No. 3, pp. 371-377, May 1977.
I. Jacobs and E. Berlekamp, "A lower bound to the distribution of computation for sequential decoding," IEEE Transactions on Information Theory, vol. 13, No. 2, pp. 167-174, Apr. 1967.
F. Jelinek, "Fast Sequential Decoding Algorithm Using a Stack," IBM Journal of Research and Development, vol. 13, No. 6, pp. 675-685, Nov. 1969.
M.-O. Jeong and S.-N. Hong, "SC-Fano Decoding of Polar Codes," arXiv:1901.06791 [cs, eess, math], Jan. 2019, 5 pages.
H. Mahdavifar, M. El-Khamy, J. Lee, and I. Kang, "Performance Limits and Practical Decoding of Interleaved Reed-Solomon Polar Concatenated Codes," IEEE Transactions on Communications, vol. 62, No. 5, pp. 1406-1417, May 2014.
K. Niu and K. Chen, "Stack decoding of polar codes," Electronics Letters, vol. 48, No. 12, pp. 695-697, Jun. 2012.
R. Pedarsani, S. H. Hassani, I. Tai, and E. Telatar, "On the construction of polar codes," 2011 IEEE International Symposium on Information Theory Proceedings (ISIT), 2011, pp. 11-15.
M. Seidl and J. B. Huber, "Improving successive cancellation decoding of polar codes by usage of inner block codes," 2010 6th International Symposium on Turbo Codes and Iterative Information Processing (ISTC), Sep. 2010, pp. 103-106.
M. Seidl and J. B. Huber, "An efficient length- and rate-preserving concatenation of polar and repetition codes," arXiv:1312.2785 [cs, math], Dec. 2013, 4 pages.
I. Tal and A. Vardy, "How to Construct Polar Codes," IEEE Transactions on Information Theory, vol. 59, No. 10, pp. 6562-6582, Oct. 2013.
I. Tal and A. Vardy, "List Decoding of Polar Codes," IEEE Transactions on Information Theory, vol. 61, No. 5, pp. 2213-2226, May 2015.
P. Trifonov and P. Semenov, "Generalized concatenated codes based on polar codes," 2011 8th International Symposium on Wireless Communication Systems (ISWCS), 2011, pp. 442-446.
P. Trifonov and V. Miloslavskaya, "Polar Codes with Dynamic Frozen Symbols and Their Decoding by Directed Search," arXiv e-print 1307.2352, Jul. 2013, 11 pages.
P. Trifonov, V. Miloslavskaya, and R. Morozov, "Fast Sequential Decoding of Polar Codes," arXiv:1703.06592 [cs, math], Mar. 2017, 19 pages.
J. Wachsmann, R. F. H. Fischer, and J. B. Huber, "Multilevel codes: theoretical concepts and practical design rules," IEEE Transactions on Information Theory, vol. 45, No. 5, pp. 1361-1391, Jul. 1999.
Y. Wang, K. R. Narayanan, and Y. C. Huang, "Interleaved Concatenations of Polar Codes with BCH and Convolutional Codes," IEEE Journal on Selected Areas in Communications, vol. 34, No. 2, Feb. 2016, pp. 267-277.
T. Wang, D. Qu, and T. Jiang, "Parity-Check-Concatenated Polar Codes," IEEE Communications Letters, vol. 20, No. 12, pp. 2342-2345, Dec. 2016.
P. H. Winston, "Artificial Intelligence, Third Edition", Addison-Wesley Publishing Company, May 1993, 640 pages.
J. M. Wozencraft and B. Reiffen, "Sequential Decoding", The MIT Press, 1961, pp. 159-165.
H. Zhang et al., "Parity-Check Polar Coding for 5G and Beyond," 2018 IEEE International Conference on Communications (ICC), 2018, pp. 1-7.
Zigangirov, K. Sh., "Some Sequential Decoding Procedures," Problems of Information Transmission, vol. 2, No. 4, pp. 13-25, 1966. (English abstract only).

(56) References Cited

OTHER PUBLICATIONS

Erdal Arikan, "From Sequential Decoding to Channel Polarization and Back Again", ARXIV.org, Aug. 26, 2019, 10 pages.
International Preliminary Report on Patentability dated Nov. 24, 2021 in connection with International Patent Application No. PCT/IB2020/055588, 17 pages.

* cited by examiner

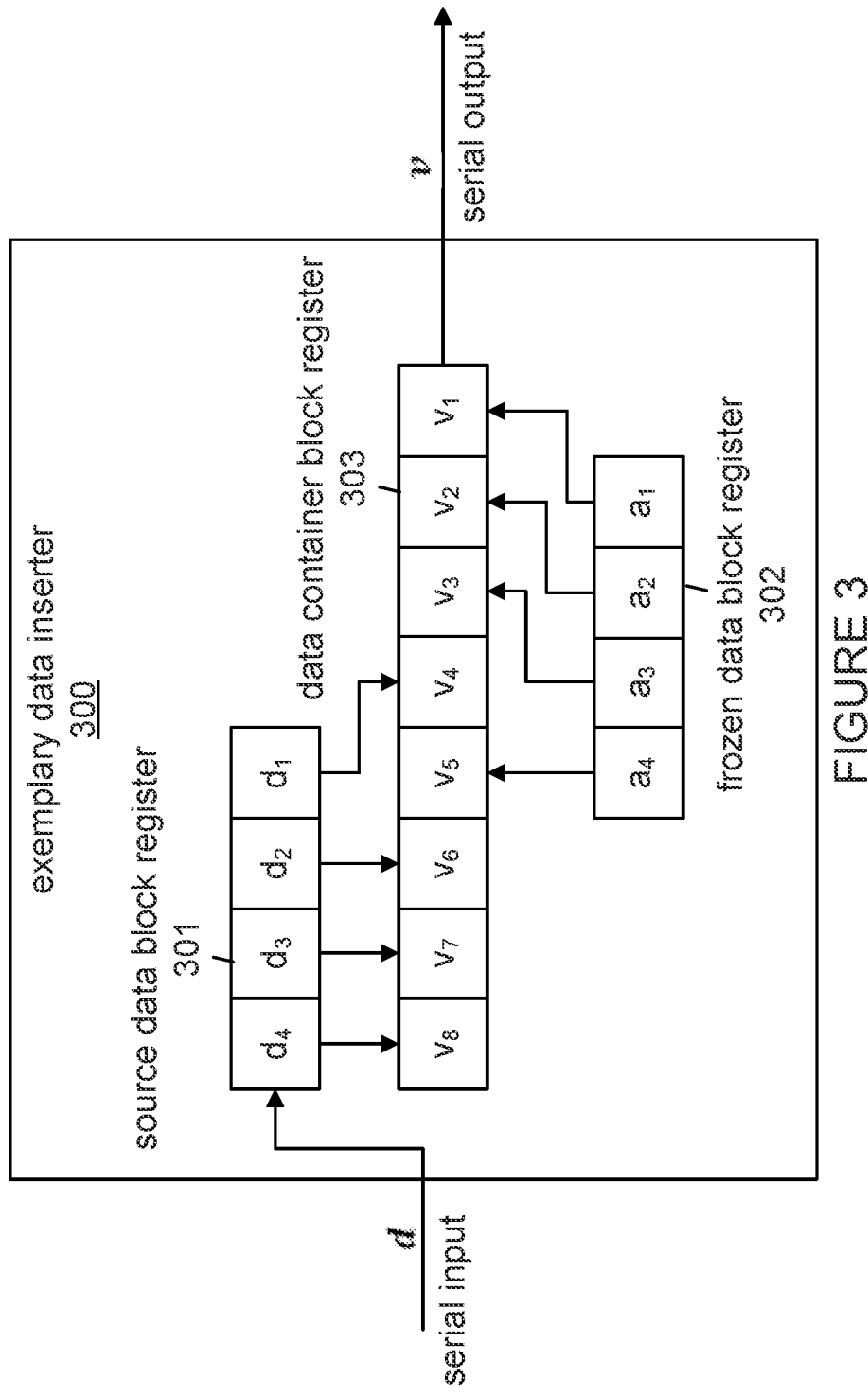

exemplary data inserter algorithm
400

Exemplary data inserter algorithm configured according to parameters $(N, \mathcal{A}, a)$.
Input: SDB $d$
Output: DCB $v$

```
1    j = 1; h = 1;              // initialize pointers to SDB and FDB
2    for i = 1 to N             // run through all elements of DCB in
                                    increments of 1
3        if i ∈ 𝒜                // check if i is a SDB coordinate
4            v_i = d_j;          // insert the next element of the SDB
5            j = j + 1;          // increment SDB pointer
6        else                    // coordinate i is an FDB coordinate
7            v_i = a_h;          // insert the next element of the FDB
8            h = h + 1;          // increment FDB pointer
9        end                     // end if
10   end                         // end for
```

FIGURE 4

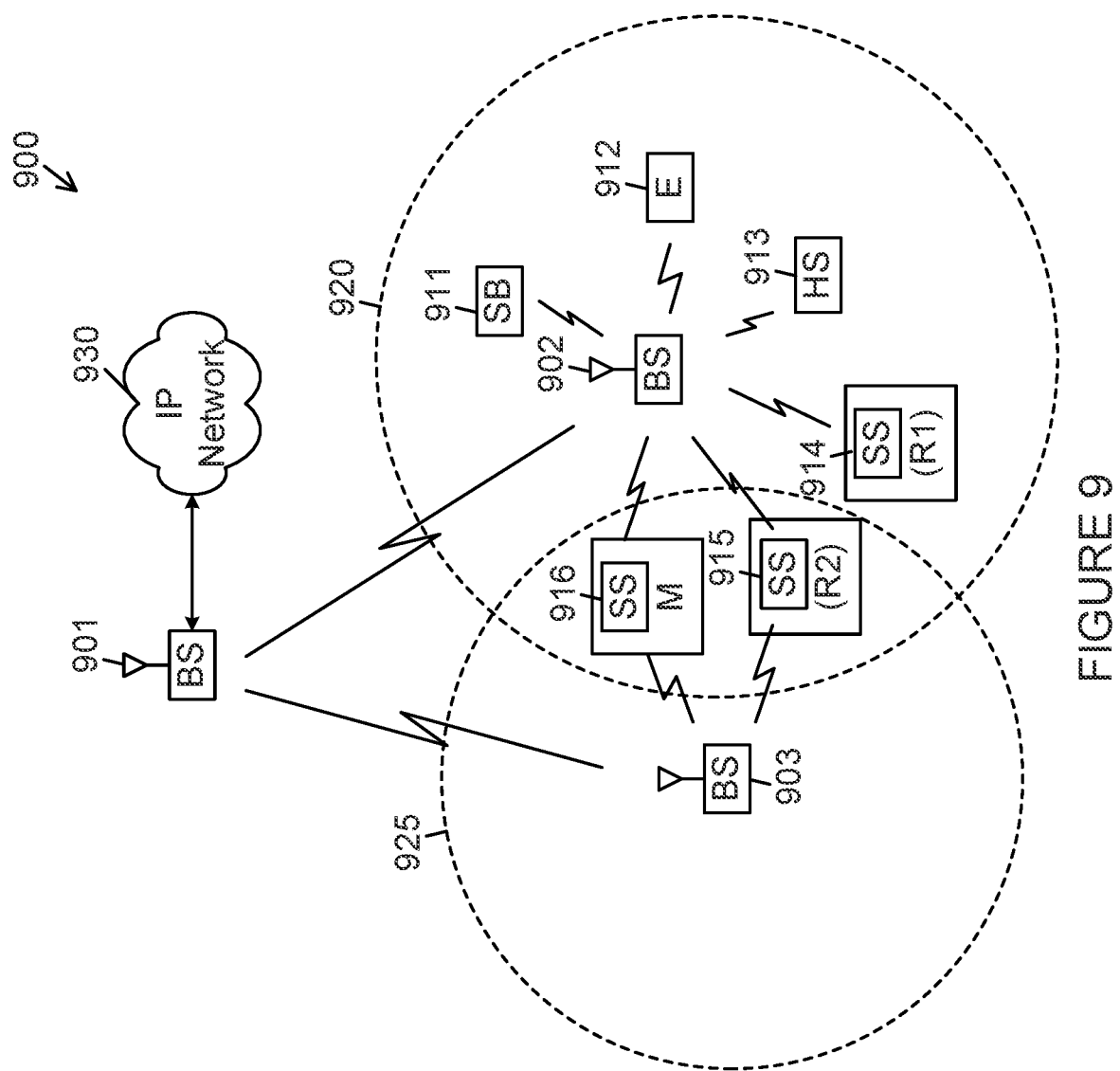

METHODS AND APPARATUS FOR ERROR CORRECTION CODING WITH TRIANGULAR FACTORIZATION OF GENERATOR MATRIX

TECHNICAL FIELD

The present disclosure is directed generally to methods and apparatus for error correction coding in a communication system, more specifically, to encoding and decoding methods and apparatus for error correction coding using triangular factorization of code generator matrix.

BACKGROUND

In modern digital data transmission (wireless telephony, wireless data transmission, optical disk transmission to a player, music players receiving music data, and so on), a channel encoder can receive a source data and add redundancy to it to protect the source data against noise in a transmission channel. A receiver at the other end of the transmission channel receives the encoded data corrupted by channel noise and/or distortion and uses a channel decoder to recover the source data. The decoded data is then forwarded to a destination, e.g., a music player, which plays the decoded data as audio, or a storage device, which stores the decoded data as a file.

Channel encoding typically works by sending a piece of data sought to be communicated, referred to as a "source data block" (SDB), through a transformation to produce a "transmitted code block" (TCB) that is better protected against errors than the SDB from which it is derived, and thus is more suitable for transmission than the SDB. For present purposes suffice it to say that linear block encoders, which multiply an SDB using a matrix, have been used for this purpose because they are able to achieve an acceptable tradeoff of offering significant (albeit not absolute) protection against noise, commonly expressed in terms of the error rates such as frame error rates (FER) that result from noise, while being of sufficiently "low complexity" in terms of the amount of computation they require. Higher complexity encoding schemes that reduce the FER of a received signal but require too much computation for expected data transmission rates are of little practical use.

Polar codes. A type of linear block code in prior art is the polar code [ARI2009], which has attracted interest by being able to achieve channel capacity using low-complexity encoding and decoding algorithms. Polar codes are based on a phenomenon called channel polarization. This disclosure aims to present a new type of code that exploits channel polarization more effectively than polar codes and provide superior FER performance. We will begin by giving a review of the state of the art in polar coding.

In order to keep the review of polar codes simple, we will consider only the binary case, where the encoder operates on vectors over the binary field $\mathbb{F}_2 = \{0,1\}$. As shown in [ARI2009], for every integer $n \geq 1$ there exists a polar code with code block length $N=2^n$ and rate $R=K/N$ for any integer $1 \leq K \leq N$. The polar code with code block length N and rate $R=K/N$ is defined by a polar transform matrix $G \in \mathbb{F}_2^{N \times N}$, a data index set $\mathcal{A}$, and a frozen data block (FDB) a, wherein the polar transform matrix G is a Kronecker power $G = F^{\otimes n}$ of a kernel matrix $$F = \begin{bmatrix} 1 & 0 \\ 1 & 1 \end{bmatrix},$$

the data index set $\mathcal{A}$ is a subset of $\{1, 2, \ldots, N\}$ with cardinality $|\mathcal{A}|=K$, and the FDB a is an arbitrary but fixed row vector from $\mathbb{F}_2^{N-K}$. An encoder for the polar code with parameters (N=$2^n$, K, $\mathcal{A}$, a) receives an SDB $d \in \mathbb{F}_2^K$ as input and produces a TCB $x \in \mathbb{F}_2^N$ by carrying out the matrix multiplication x=uG wherein $u \in \mathbb{F}_2^N$ is a transform input block comprising a data part $u_\mathcal{A}=d$ and a frozen part $u_{\mathcal{A}^c}=a$. (The notation $u_\mathcal{A}$ denotes the part of u that remains after discarding all coordinates of u whose indices are not in $\mathcal{A}$.) The performance of a polar code depends critically on the choice of the data index set $\mathcal{A}$. In polar coding, the data index set $\mathcal{A}$ is chosen based on a phenomenon called channel polarization. The FDB a is typically set to an all-zero vector.

To discuss channel polarization in some detail, consider the design of a polar code with parameters (N=$2^n$, K, $\mathcal{A}$, a) for transmitting data over a given binary-input memoryless channel (BMC) W with input alphabet $X = \mathbb{F}_2$, output alphabet Y, and transition probabilities W(y|x) for $x \in X$ and $y \in Y$. Due to the memoryless channel assumption, the conditional probability that a channel output block $y=(y_1, y_2, \ldots, y_N) \in Y^N$ is received, given that a channel input block $x=(x_1, x_2, \ldots, x_N) \in \mathbb{F}_2^N$ is sent over the BMC W, is given by the product-form transition probability $W^N(y|x) = \Pi_{i=1}^N W(y_i|x_i)$. In polar coding, one synthesizes N bit-channels from N independent copies of the BMC W. The bit-channels are indexed by integers from 1 to N, and the ith bit-channel has transition probabilities $$W_N^{(i)}(y, u^{i-1} | u_i) = \sum_{u_{i+1}^N} \frac{1}{2^{(N-i)}} W^N(y | uG)$$

where $y \in Y^N$, $u^{i-1} \in \mathbb{F}_2^{i-1}$, $u_i \in \mathbb{F}_2$, $u_{i+1}^N \in \mathbb{F}_2^{N-i}$, $u=(u^{i-1},u_i,u_{i+1}^N) \in \mathbb{F}_2^N$, and $G=F^{\otimes n}$. The ith bit-channel $W_N^{(i)}$ can be interpreted as a BMC with input alphabet $\mathbb{F}_2$, output alphabet $Y^N \times \mathbb{F}_2^{i-1}$, and transition probabilities $W_N^{(i)}(y,u^{i-1}|u_i)$ for $(y,u^{i-1}) \in Y^N \times \mathbb{F}_2^{i-1}$ and $u_i \in \mathbb{F}_2$. Operationally, the ith bit-channel $W_N^{(i)}$ connects the ith transform input $u_i$ to the output symbols $(y,u^{i-1})$, with $u_{i+1}^N$ acting as interference. At the receiver side, the bit-channels become accessible under a certain type of decoding called successive cancellation (SC) decoding [ARI2009]. A recommended method of selection of the data index set A requires computation of the symmetric capacities $\{I(W_N^{(i)})\}_{i=1}^N$ of the bit-channels, where the symmetric capacity of an arbitrary BMC W is defined by the formula $$I(W) = \sum_{y \in Y} \sum_{x \in \mathbb{F}_2} \frac{1}{2} W(y|x) \log_2 \left( \frac{2W(y|x)}{W(y|0) + W(y|1)} \right).$$

Efficient methods are known for computing $\{I(W_N^{(i)})\}_{i=1}^N$ to any degree of numerical precision [PED2011], [TAL2013]. After $\{I(W_N^{(i)})\}_{i=1}^N$ are computed, the bit-channels $\{W_N^{(i)}\}_{i=1}^N$ are listed in decreasing order of their symmetric capacities, and the indices of the first K bit-channels in the sorted list are selected as the data index set $\mathcal{A}$. This method for selecting the data index set $\mathcal{A}$ ensures that the SDB bits are carried by bit-channels with the largest symmetric capacities.

The main polarization theorem in [ARI2009] states that, as N becomes large, the symmetric capacities $\{I(W_N^{(i)})\}_{i=1}^N$ for the bit-channels converge to 0 or 1, except for an asymptotically vanishing fraction. This phenomenon is called channel polarization. As N becomes large, the fraction of bit-channels whose symmetric capacity polarizes to 1 approaches I(W), while the fraction of bit-channels whose symmetric capacity polarizes to 0 approaches 1−I(W). Based on this asymptotic result and its refinements, it is shown in [ARI2009], [ARI2009b] that polar codes can be operated at data transmission rates approaching I(W) while having a probability of error that goes to zero roughly exponentially in $\sqrt{N}$ and with encoding and decoding complexity O(N log N).

Although polar codes achieve the Shannon limit asymptotically as the code block length N increases, their performance at practical block-lengths N has been disappointing. The relatively inferior performance of polar codes at practical block-lengths is due in part to the weakness of the low-complexity decoding methods that are commonly employed with polar codes, such as successive cancellation [ARI2009] and belief propagation [ARI2008] decoding algorithms. However, even under the optimal maximum likelihood (ML) decoding, polar codes are not competitive with the prior art in error correction coding [ARI2009c]. To remedy this situation, several methods have been proposed that improved the performance of polar codes at the expense of complexity. Before we survey such methods, we will discuss a precursor coding scheme to polar for a proper perspective on the state-of-the-art in polar coding as well as the main ideas behind the present principles.

We will begin with a description of sequential decoding since it played a prominent role in the development of polar coding and will play a similar role for the present principles. Sequential decoding is a decoding algorithm for convolutional codes (more generally any kind of tree code) introduced originally by Wozencraft [WOZ1961]. Some well-known versions of sequential decoding are the Fano algorithm [FAN1963] and the stack algorithm [ZIG1966], [JEL1969]. In essence, sequential decoding is a depth-first tree-search heuristic for finding the transmitted codeword in a tree code given the channel output. It is known that the search complexity in sequential decoding varies with the severity of noise in the channel [JAC1967]. The variable nature of the computation in sequential decoding restricts its practical applicability to coding rates below a cutoff rate, which is a channel parameter that can be significantly smaller than the symmetric capacity of the same channel. The cutoff rate of an arbitrary BMC W is defined by $$R_0(W) = 1 - \log_2\left(1 + \sum_{y \in Y} \sqrt{W(y|0)W(y|1)}\right).$$

It turns out that $R_0(W)$ is a limit on the cutoff rate of sequential decoding only if a single sequential decoder is used to decode a code. If a decoding problem is split into several smaller decoding problems and a separate sequential decoder is assigned to each smaller decoding problem, then the cutoff rate of the new scheme is no longer bounded by $R_0(W)$, as shown in [ARI2006]. As discussed in detail in [ARI2016], polar coding was developed as the inner code in a generalized concatenated coding (GCC) scheme (see below for a description of GCC schemes) that employed multiple outer convolutional codes with as many sequential decoders. This GCC scheme boosted the cutoff rate of N independent copies of a BMC W from $NR_0(W)$ to $\Sigma_{i=1}^{N} R_0(W_N^{(i)})$. Furthermore, thanks to the channel polarization phenomenon, the normalized sum cutoff rate $$\left(\frac{1}{N}\right)\Sigma_{i=1}^{N} R_0(W_N^{(i)})$$

approached the symmetric capacity I(W) as N became large. Thus, the GCC scheme was a capacity-achieving scheme, but it was too complex to be practical. On the other hand, channel polarization also meant that, as N became large, the GCC scheme could be simplified drastically by eliminating the outer convolutional codes and the sequential decoders. For large enough N, close to NI(W) of the bit-channels had their symmetric capacity $I(W_N^{(i)})$ so close to 1 that uncoded transmission on those bit-channels could be supported with high reliability. The sum of the symmetric capacities of the remaining bit-channels was a negligible fraction of the total symmetric capacity NI(W), so the inputs to the remaining bit-channels could be fixed to 0 without incurring any significant capacity loss, while also ensuring that the decoder would not make any decision errors on those bit-channels. What resulted after the GCC scheme was stripped of its outer encoders and decoders in this way was a stand-alone polar code. Unfortunately, the stand-alone polar code was not strong enough to be competitive with the state-of-the-art in channel coding. Several methods have been proposed subsequently to strengthen the polar code performance. We will now review some of these prior art methods that appear most relevant to the present disclosure.

Concatenated coding. A method that proved very effective in improving the performance of polar coding is concatenated coding, which is a method of combining two or more codes in tandem so as to create a more powerful code. The idea of concatenated coding can be traced back to the product coding method of Elias [ELI1954]. The seminal work on concatenated coding is Forney's monograph [FOR1966]. In Forney's concatenation scheme, a source data block is first encoded by an outer encoder into an outer codeword from an outer code, and the outer codeword is encoded by an inner encoder into an inner codeword from an inner code. The references [SEI2010], [SEI2013], [TRI2013], [TAL2015], [HUA2016], [WAN2016], [CHE2017], [WUX2018], and [ZHA2018] apply concatenated coding with polar codes as inner codes and various parity-check codes as outer codes. In particular, the scheme in [TAL2015], which uses simple cyclic redundancy check (CRC) codes of rate close to 1 as outer codes, has proven very effective in improving polar code performance to the point that polar codes have been adopted as part of the 3GPP NR standard [3GP2018], [BIO2018]. The decoder in [TAL2015] combines list decoding with successive cancellation decoding and is commonly called a CRC-aided successive cancellation list (CA-SCL) decoder.

The overall rate of a concatenated coding scheme is given by $R=R_{out}R_{in}$, wherein $R_{out}$ and $R_{in}$ are the rates of the outer and inner codes, respectively. Thus, in any concatenated coding system, one has to have both $R_{out} \geq R$ and $R_{in} \geq R$. Note that concatenated coding schemes with $R_{out}=1$ or $R_{in}=1$ are extreme cases, where either the outer code or the inner code is essentially non-existent. In an ordinary concatenated coding scheme, one has $R_{out}>R$ and $R_{in}>R$, and all concatenated polar coding systems in the prior art are designed to operate in the regime $R_{out}>R$ and $R_{in}>R$. Having $R_{in}>R$ corresponds to solving a more formidable coding problem than the original one at rate R, which is likely to increase complexity of the inner decoder (just as an SCL decoder is more complex than an SC decoder). It is an object of the present principles to avoid the rate inflation $R_{in} > R$ caused by ordinary concatenated coding. To this end, the present principles in their preferred embodiments aim to operate as an extreme form of concatenated coding with $R_{out} = R$ and $R_{in} = 1$.

Generalized concatenated coding (GCC). A second method that has been used to improve the performance of polar codes is the GCC method, which was developed by Blokh and Zyablov [BLO1974] as a generalization of Forney's concatenated coding scheme by allowing multiple outer encoders and decoders. (Actually, as we have seen above, polar codes were originally developed as part of a GCC scheme.) In a typical GCC scheme, the source data is first encoded into a two-dimensional array $U = (U_{j,m})$, $1 \le j \le J$, $1 \le m \le M$, of binary symbols so that the jth row of U is a codeword in a jth outer code (block or convolutional) of length M (a common M for all outer codes). The rate $R_j$ of the jth outer code is chosen in accordance with some design metric, such as the amount of mutual information or cutoff rate available to a jth decoder at the receiver side [WAC1999]. The array U is then encoded into a codeword array $X = (X_{i,m})$, $1 \le i \le N$, $1 \le m \le M$, by encoding each column of U using an inner code of block length N and rate J/N. The decoder in a GCC system is split into two functional modules, an inner decoder module consisting of M copies of an inner decoder (one for each column of X) and an outer decoder module consisting of J outer decoders (one for each row of U). The inner and outer decoder modules exchange information to carry out the decoding task in a coordinated manner, usually employing a multi-stage decoding scheme as in [IMA1977]. The essential idea of GCC coding is to present to the outer codes a memoryless channel through the interleaving operation effected by the two-dimensional structure of the code, which is an idea that goes back to product coding [ELI1954].

Examples of papers that study GCC in the context of polar codes are [ARI2009d], [BAK2010], [TRI2011], [MAH2014], and [WAN2015]. In these references, the inner code is a polar code while the types of outer codes vary. A major disadvantage of GCC is its high complexity. Each outer code in a GCC scheme operates at a different rate and requires a separate decoder customized to that code rate. Furthermore, GCC increases the length of the overall code from N for a standalone inner code to MN in the GCC scheme, which further adds to the overall system complexity. It is an object of the present principles to avoid the length inflation caused by GCC schemes and the complexity penalty that accompanies it.

Decoding methods. A third body of work in the prior art aims to improve the performance of polar codes by using decoding algorithms that are more powerful than SC decoding, which is the benchmark decoding algorithm for polar codes. For a unified treatment of such decoding algorithms, it is beneficial to view the decoding of a polar code as a tree search problem where the objective is to find the path in the code tree that is most likely to be the transmitted path given the channel output. The tree-search viewpoint paves the way to using tree-search algorithms as decoders for codes that can be represented in the form of a tree. Indeed, some well-known decoders for polar codes can be associated with specific tree-search algorithms. For example, the SC decoder is a depth-first tree-search algorithm without backtracking. The SCL decoder is a breadth-first search algorithm known as beam search (see p. 84, [WIN1984]). The sequential decoding algorithm is a depth-first search algorithm with backtracking. (Sequential decoding was applied to polar codes by [NIU2012], [TRI2017], and [JEO2019].)

The present principles. Having reviewed the prior art, we now state some of the essential features of the present principles. The present principles recognize that some form of concatenation is necessary in order to improve the performance of polar coding. To that end, the present disclosure introduces a new class of linear block codes called triangular factorization (TF) codes. The encoding operation for a TF code resembles that of a polar code. In TF coding, a SDB $d \in \mathbb{F}_2^K$ is mapped into a TCB $x \in \mathbb{F}_2^N$ by a matrix multiplication $x = vG$ wherein $G \in \mathbb{F}_2^{N \times N}$ is an arbitrary matrix with a non-trivial triangular factorization and $v \in \mathbb{F}_2^N$ is a vector that comprises a data part $v_{\mathcal{A}} = d$ and a frozen part $v_{\mathcal{A}^c} = a$. By a non-trivial triangular factorization, we mean for example a factorization of the form $G = G_{out} G_{in}$ where $G_{out}$ is an upper-triangular matrix and $G_{in}$ is a lower-triangular matrix. In TF coding, the role of $G_{in}$ is to create channel polarization by gathering global channel information and the role of $G_{out}$ is to create a tree code that can be decoded using a tree-search algorithm. The motivation here is to help the tree-search algorithm by presenting to it polarized channel information that is more reliable than raw channel information.

A critical part of the construction of a TF code is the selection of the data index set $\mathcal{A}$, which regulates the rate of flow of new information into the TF encoder. The present principles present a framework that makes it possible to choose the data index set $\mathcal{A}$ so as to match the information intake of the TF encoder with the channel information available from an inner decoder so as to lessen information bottlenecks in the course of decoding the outer tree code by a sequential decoder.

Comparison with the prior art. As stated above, TF codes aim to operate as an extreme form of concatenated coding with $R_{out} = R$ and $R_{in} = 1$, and in their preferred embodiments come close to achieving this. TF coding does not rely on the error correction capability of an inner code. The role of the inner code in TF coding is to create polarization so that the outer code can be decoded more efficiently. In contrast, all concatenated or generalized concatenated coding schemes reviewed in this section, rely on the error correction capability of the inner code.

Sequential decoding has been used with polar codes in the works [NIU2012], [TRI2017], and [JEO2019] but in decoding a polar code. The present principles in their most preferred embodiment use a sequential decoder to decode an outer tree code, with an inner polar code of rate 1 acting as a channel polarizer. Unlike prior-art techniques on concatenated coding schemes with an inner polar code, the present principles use the inner polar code not for error correction purposes but as a means of creating polarization so that an outer tree code can be searched more efficiently by a sequential decoder (or some other tree search heuristic).

Further evidence regarding the novelty and utility of the present principles will be provided below after a detailed description of the present principles. A simulation study will show that codes constructed in accordance with the present principles are capable of improving by a wide margin the FER performance of prior art schemes on polar coding.

As a final point, we should point out that the term convolutional polar coding has been used in the literature in a sense unrelated to the present principles. In [FER2017], a new type of polar code was defined by replacing the kernel of standard polar codes by a new type of kernel, and the resulting codes were called convolutional polar codes. The present principles use regular polar coding kernels.

REFERENCES

[3GP2018] 3GPP, "3GPP TS 38.212: 'Multiplexing and channel coding (Release 15).'" 3GPP, June 2018.

[ARI2006] E. Arikan, "Channel combining and splitting for cutoff rate improvement," *IEEE Transactions on Information Theory*, vol. 52, no. 2, pp. 628-639, February 2006.

[ARI2008] E. Arikan, "A Performance Comparison of Polar Codes and Reed-Muller Codes," *IEEE Communications Letters*, vol. 12, no. 6, pp. 447-449, June 2008.

[ARI2009] E. Arikan, "Channel Polarization: A Method for Constructing Capacity-Achieving Codes for Symmetric Binary-Input Memoryless Channels," *IEEE Transactions on Information Theory*, vol. 55, no. 7, pp. 3051-3073, July 2009.

[ARI2009b] E. Arikan and E. Telatar, "On the rate of channel polarization," in *IEEE International Symposium on Information Theory, 2009. ISIT 2009*, 2009, pp. 1493-1495.

[ARI2009c] E. Arikan, H. Kim, G. Markarian, U. Ozgur, and E. Poyraz, "Performance of short polar codes under ML decoding," in *Proc. ICT-Mobile Summit* 2009, Santander, Spain, 2009.

[ARI2009d] E. Arikan and G. Markarian, "Two-dimensional polar coding," in *Proc. Tenth International Symposium on Coding Theory and Applications (ISCTA '09)*, Ambleside, UK, 2009.

[ARI2016] E. Arikan, "On the Origin of Polar Coding," *IEEE Journal on Selected Areas in Communications*, vol. 34, no. 2, pp. 209-223, February 2016.

[BAK2010] M. Bakshi, S. Jaggi, and M. Effros, "Concatenated Polar codes," in *2010 IEEE International Symposium on Information Theory Proceedings (ISIT)*, 2010, pp. 918-922.

[BIO2018] V. Bioglio, C. Condo, and I. Land, "Design of Polar Codes in 5G New Radio," arXiv: 1804.04389 [cs, math], April 2018.

[BLO1974] Blokh, E. L. and Zyablov, V. V., "Coding of Generalized Concatenated Codes," *Problems Inform. Transmission*, vol. 10, no. 3, pp. 218-222, 1974.

[CHE2017] J. Chen, Y. Chen, K. Jayasinghe, D. Du, and J. Tan, "Distributing CRC Bits to Aid Polar Decoding," in *2017 IEEE Globecom Workshops (GC Wkshps)*, 2017, pp. 1-6.

[ELI1954] P. Elias, "Error-free Coding," *Transactions of the IRE Professional Group on Information Theory*, vol. 4, no. 4, pp. 29-37, September 1954.

[FAN1963] R. Fano, "A heuristic discussion of probabilistic decoding," *IEEE Transactions on Information Theory*, vol. 9, no. 2, pp. 64-74, April 1963.

[FER2017] A. J. Ferris, C. Hirche, and D. Poulin, "Convolutional Polar Codes," arXiv: 1704.00715 [cs, math], April 2017.

[FOR1966] G. D. Forney Jr, *Concatenated Codes*. The MIT Press, 1966.

[HUA2016] Huawei HiSilicon, "Details of the polar code design," Reno, USA, R1-1611254, November 2016.

[IMA1977] H. Imai and S. Hirakawa, "A new multilevel coding method using error-correcting codes," *IEEE Transactions on Information Theory*, vol. 23, no. 3, pp. 371-377, May 1977.

[JAC1967] I. Jacobs and E. Berlekamp, "A lower bound to the distribution of computation for sequential decoding," *IEEE Transactions on Information Theory*, vol. 13, no. 2, pp. 167-174, April 1967.

[JEL1969] F. Jelinek, "Fast Sequential Decoding Algorithm Using a Stack," *IBM Journal of Research and Development*, vol. 13, no. 6, pp. 675-685, November 1969.

[JEO2019] M.-O. Jeong and S.-N. Hong, "SC-Fano Decoding of Polar Codes," arXiv: 1901.06791 [cs, eess, math], January 2019.

[MAH2014] H. Mandavifar, M. El-Khamy, J. Lee, and I. Kang, "Performance Limits and Practical Decoding of Interleaved Reed-Solomon Polar Concatenated Codes," *IEEE Transactions on Communications*, vol. 62, no. 5, pp. 1406-1417, May 2014.

[NIU2012] K. Niu and K. Chen, "Stack decoding of polar codes," *Electronics Letters*, vol. 48, no. 12, pp. 695-697, 2012.

[PED2011] R. Pedarsani, S. H. Hassani, I. Tal, and E. Telatar, "On the construction of polar codes," in *2011 IEEE International Symposium on Information Theory Proceedings (ISIT)*, 2011, pp. 11-15.

[SEI2010] M. Seidl and J. B. Huber, "Improving successive cancellation decoding of polar codes by usage of inner block codes," in *2010 6th International Symposium on Turbo Codes and Iterative Information Processing (ISTC)*, 2010, pp. 103-106.

[SEI2013] M. Seidl and J. B. Huber, "An efficient length- and rate-preserving concatenation of polar and repetition codes," arXiv: 1312.2785 [cs, math], December 2013.

[TAL2013] I. Tal and A. Vardy, "How to Construct Polar Codes," *IEEE Transactions on Information Theory*, vol. 59, no. 10, pp. 6562-6582, October 2013.

[TAL2015] I. Tal and A. Vardy, "List Decoding of Polar Codes," *IEEE Transactions on Information Theory*, vol. 61, no. 5, pp. 2213-2226, May 2015.

[TRI2011] P. Trifonov and P. Semenov, "Generalized concatenated codes based on polar codes," in *2011 8th International Symposium on Wireless Communication Systems (ISWCS)*, 2011, pp. 442-446.

[TRI2013] P. Trifonov and V. Miloslayskaya, "Polar Codes with Dynamic Frozen Symbols and Their Decoding by Directed Search," arXiv e-print 1307.2352, July 2013.

[TRI2017] P. Trifonov, V. Miloslayskaya, and R. Morozov, "Fast Sequential Decoding of Polar Codes," arXiv: 1703.06592 [cs, math], March 2017.

[WAC1999] U. Wachsmann, R. F. H. Fischer, and J. B. Huber, "Multilevel codes: theoretical concepts and practical design rules," IEEE Transactions on Information Theory, vol. 45, no. 5, pp. 1361-1391, July 1999.

[WAN2015] Y. Wang, K. R. Narayanan, and Y. C. Huang, "Interleaved Concatenations of Polar Codes with BCH and Convolutional Codes," *IEEE Journal on Selected Areas in Communications*, vol. PP, no. 99, pp. 1-1, 2015.

[WAN2016] T. Wang, D. Qu, and T. Jiang, "Parity-Check-Concatenated Polar Codes," *IEEE Communications Letters*, vol. 20, no. 12, pp. 2342-2345, December 2016.

[WIN1984] P. H. Winston, *Artificial Intelligence*, $2^{nd}$ ed. Addison-Wesley, Reading Mass., 1984.

[WOZ1961] J. M. Wozencraft and B. Reiffen, *Sequential Decoding*. MIT Press: Cambridge, Mass., 1961.

[ZHA2018] H. Zhang et al., "Parity-Check Polar Coding for 5G and Beyond," in *2018 IEEE International Conference on Communications (ICC)*, 2018, pp. 1-7.

[ZIG1966] Zigangirov, K. Sh., "Some Sequential Decoding Procedures," *Problems Inform. Transmission*, vol. 2, no. 4, pp. 1-10, 1966.

The above-listed publications are incorporated herein by reference.

SUMMARY

An encoder apparatus for use in a communication system for reliable transfer of a source data block d includes an outer transform configured to receive a data container block v and compute an outer transform block u, whereby $u=vG_{out}$ for an outer transform matrix $G_{out}$. The encoder apparatus also includes an inner transform configured to receive the outer transform block u and compute a transmitted code block x, whereby $x=uG_{in}$ for an inner transform matrix $G_{in}$. The data container block v is obtained from the source data block d and a frozen data block a. The frozen data block a is a predetermined block of symbols. The outer transform matrix $G_{out}$ and the inner transform matrix $G_{in}$ form a triangular factorization of a transform matrix G, whereby $G=G_{out}G_{in}$. The transform matrix G is a non-triangular matrix. The outer transform matrix $G_{out}$ is optionally a strictly upper-triangular matrix. The inner transform matrix $G_{in}$ is optionally a strictly lower-triangular matrix. The outer transform matrix $G_{out}$ is optionally a Toeplitz matrix defined by a causal impulse response $c=(c_0, c_1, \ldots, c_m)$, wherein $m>0$, $c_0 \neq 0$, and $c_m \neq 0$. The inner transform matrix $G_{in}$ optionally has the form of a Kronecker product $G_{in}=L_1 \otimes \ldots \otimes L_n$, wherein the $L_i$ is a lower-triangular matrix for each $i=1, \ldots, n$, wherein $L_i$ may equal $$\begin{bmatrix} 1 & 0 \\ 1 & 1 \end{bmatrix}$$

for each $i=1, \ldots, n$. The data container block optionally carries the source data block d transparently in a subset of coordinates indicated by a data index set $\mathcal{A}$ and the frozen data block a in the coordinates complimentary to the data index set $\mathcal{A}$. The data index set $\mathcal{A}$ may be chosen by a criterion that ranks the coordinates in accordance with a score function. The score function may be the Hamming score function.

A decoder apparatus decodes a received code block, the received code block representing a noisy version of a transmitted code block, the transmitted code block obtained by encoding a source data block by a predetermined encoder including an outer transform configured to receive a data container block v and compute an outer transform block u, whereby $u=vG_{out}$ for an outer transform matrix $G_{out}$, and an inner transform configured to receive the outer transform block u and compute a transmitted code block x, whereby $x=uG_{in}$ for an inner transform matrix $G_{in}$, and where the data container block v is obtained from the source data block d and a frozen data block a, the frozen data block a is a predetermined block of symbols, wherein the outer transform matrix $G_{out}$ and the inner transform matrix $G_{in}$ form a triangular factorization of a transform matrix G, whereby $G=G_{out}G_{in}$, and the transform matrix G is a non-triangular matrix. The decoder apparatus includes an inner decoder and an outer decoder. The inner decoder is configured to receive the received code block, receive node metric requests from the outer decoder, and send calculated node metrics to the outer decoder. The outer decoder is configured to send node metric requests to the inner decoder, receive calculated node metrics from the inner decoder, and calculate a decoded data container block. The decoder apparatus is further configured to extract a decoded source data block from the decoded data container block. The inner decoder optionally generates the node metric values in accordance with a successive cancellation decoder for polar codes. The outer decoder optionally calculates the decoded data container block by using a tree search algorithm using a node metric. The tree search algorithm may be a depth-first tree search algorithm. The node metric may be the Fano metric.

BRIEF DESCRIPTION OF THE DRAWINGS

FIG. 3 is a circuit for implementing an exemplary hardware data inserter for use with the system of FIG. 2;

FIG. 4 is a pseudo code for implementing an exemplary data inserter in software for use with the system of FIG. 2;

FIG. 9 illustrates an example wireless network within which error correction coding may be implemented according to this disclosure;

DETAILED DESCRIPTION

Figure 1:
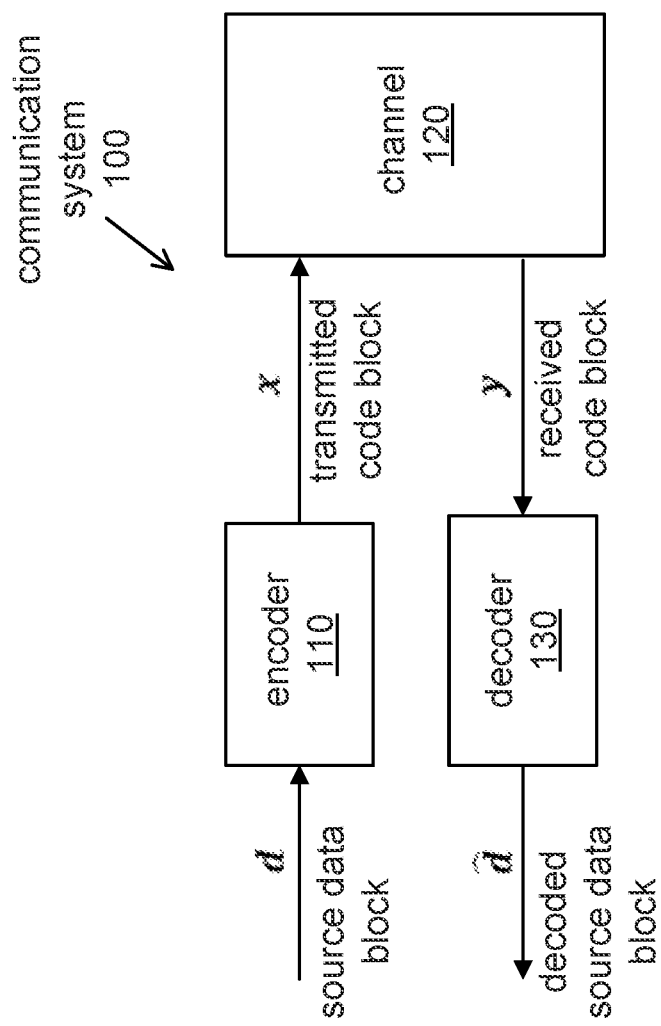
FIG. 1 is a functional block diagram of a communication system employing error correction coding in accordance with embodiments of the present disclosure.

FIGS. 1 through 10B, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged communication system.

Notation. For any set $\mathcal{A}$ and integer $m \geq 1$, $\mathcal{A}^m$ denotes the set of m-tuples over $\mathcal{A}$. If $a=(a_1, a_2, \ldots, a_m) \in \mathcal{A}^m$ and i,j are integers satisfying $1 \leq i \leq j \leq m$, we will use the notation $a_i^j$ as a short-hand for the portion $(a_i, a_{i+1}, \ldots, a_j)$ of a consisting of coordinates from i to j. We will interpret $a_i^j$ as null if $j<i$. Given $a=(a_1, a_2, \ldots, a_m) \in \mathcal{A}^m$ and any set $\mathcal{S} \subset \{1, 2, \ldots, m\}$ of indices (coordinates) of a, we use the notation $a\mathcal{S}$ to denote the tuple $a\mathcal{S} = (a_i : i \in \mathcal{S})$ that consists of the elements of a with indices in $\mathcal{S}$; the notation $a\mathcal{S}^c = (a_i : i \in \mathcal{S}^c)$ denotes the vector that consists of the elements of a with indices in $\mathcal{S}^c$ wherein $\mathcal{S}^c$ denotes the set of indices of a that is complimentary to the set $\mathcal{S}$. For example, let m=8 and $\mathcal{S} = \{1,2,3,5,8\}$. Then, $a\mathcal{S} = (a_1, a_2, a_3, a_5, a_8)$ and a $\mathcal{S}^c$=($a_4$, $a_6$, $a_7$). (We define a$\mathcal{S}$ so that a$\mathcal{S}$ does not depend on the order in which the elements of $\mathcal{S}$ are listed; e.g., a $\mathcal{S}$=($a_1$, $a_2$, $a_3$, $a_5$, $a_8$) for $\mathcal{S}$={2,3,1,5,8}.)

We will consider matrices over arbitrary finite fields $\mathbb{F}_q$={0, 1, ..., q−1} with q a prime power. The notation $\mathbb{F}_q^{m \times n}$ denotes the set of all m-by-n matrices with elements from $\mathbb{F}_q$. Thus, $A \in \mathbb{F}_q^{m \times n}$ indicates that A is a matrix with m rows and n columns. When we need to refer to the elements of $A \in \mathbb{F}_q^{m \times n}$, we use the notation $a_{i,j}$ to denote the element in the ith row and jth column of A, for $1 \le i \le m$, $1 \le j \le n$. A matrix $P \in \mathbb{F}_q^{n \times n}$ is called a permutation matrix if P is a 0-1 matrix that has exactly one 1 in each row and in each column. A matrix $A \in \mathbb{F}_q^{n \times n}$ is called lower-triangular if $a_{i,j}=0$ for all $1 \le i < j \le n$. A matrix $A \in \mathbb{F}_q^{n \times n}$ is called upper-triangular if $a_{i,j}=0$ for all $1 \le j < i \le n$. A matrix $A \in \mathbb{F}_q^{n \times n}$ is called strictly lower triangular if $a_{i,j}=0$ for all $1 \le i \le j \le n$ and $a_{i,j} \ne 0$ for at least one $a_{i,j}$ with indices $1 \le j < i \le n$. A matrix $A \in \mathbb{F}_q^{n \times n}$ is called strictly upper triangular if $a_{i,j}=0$ for all $1 \le j \le i \le n$ and $a_{i,j} \ne 0$ for at least one $a_{i,j}$ with indices $1 \le i < j \le n$. A matrix A is called diagonal if $a_{i,j}=0$ for all $i \ne j$. The diagonal matrix with is on the diagonal is called the identity matrix and denoted I. A matrix $A \in \mathbb{F}_q^{n \times n}$ is called non-singular or invertible if there exists a matrix $B \in \mathbb{F}_q^{n \times n}$ (called the inverse of A) such that AB=BA=I. If it exists, the inverse of A is denoted $A^{-1}$. A matrix $A \in \mathbb{F}_q^{n \times n}$ is called upper-triangular Toeplitz with impulse response c=($c_0$, $c_1$, ..., $c_{n-1}$)$\in \mathbb{F}_q^n$ if A is an upper-triangular matrix and $a_{i,j}=c_{j-i}$ for $j \ge i$, i.e., if A has the form $$A = \begin{bmatrix} c_0 & c_1 & c_2 & \cdots & c_{n-1} \\ 0 & c_0 & c_1 & \cdots & c_{n-2} \\ 0 & 0 & c_0 & \cdots & c_{n-3} \\ \vdots & \vdots & \vdots & \ddots & \vdots \\ 0 & 0 & 0 & \cdots & c_0 \end{bmatrix}.$$

The Kronecker product of two matrices $A \in \mathbb{F}_q^{m \times n}$ and $B \in \mathbb{F}_q^{k \times l}$ is defined as the matrix $$A \otimes B = \begin{bmatrix} a_{1,1}B & a_{1,2}B & a_{1,3}B & \cdots & a_{1,n}B \\ a_{2,1}B & a_{2,2}B & a_{2,3}B & \cdots & a_{2,n}B \\ a_{3,1}B & a_{3,2}B & a_{3,3}B & \cdots & a_{3,n}B \\ \vdots & \vdots & \vdots & \ddots & \vdots \\ a_{m,1}B & a_{m,2}B & a_{m,3}B & \cdots & a_{m,n}B \end{bmatrix} \in \mathbb{F}_q^{mk \times nl}.$$

The nth Kronecker power $A^{\otimes n}$ of a matrix A is defined inductively as $A^{\otimes 1}=A$ and $A^{\otimes n}=A \otimes A^{\otimes(n-1)}$ for $n \ge 2$.

Initially turning to FIG. 1, a communication system 100 is shown in which embodiments of the present principles may be used. The communication system 100 receives a source data block (SDB) d from a source and delivers it as a decoded source data block (DSDB) d̂ to a destination. (The source and destination are not shown in the figure and fall outside the scope of the present principles.) A frame error is said to occur when the DSDB d̂ does not match the SDB d exactly, i.e., when d̂≠d. A performance criterion for the communication system 100 is the frame error rate (FER), defined as the probability of decision error, Pr(d̂≠d). It is in general preferable to have a communication system 100 with as small a FER as feasible within constraints on channel bandwidth, equipment cost, system latency, data throughput, etc. The communication system 100 comprises an encoder 110 located at a transmitter side, a channel 120 connecting the transmitter side to a receiver side, and a decoder 130 at the receiver side. The encoder 110 in the communication system 100 receives the SDB d and encodes it into a transmitted code block (TCB) x. The channel 120 comprises a channel input and a channel output. The encoder 110 applies the TCB x to the channel input. The channel receives the TCB x applied to the channel input and produces in response a received code block (RCB) y at the channel output. The decoder 130 receives the RCB y from the channel output and processes the RCB y to produce the DSDB d̂.

It will be apparent to those skilled in the art that the channel 120 incorporates many functional blocks (such as modulator, digital-to-analog converter, power amplifier, transmit and receive antennas, signal acquisition and synchronization circuitry, analog-to-digital converter, demodulator) that are essential for the operation of a communication system. The present principles are primarily about the design of the encoder 110 and the decoder 130.

We will represent the SDB as a vector d=($d_1$, $d_2$, ..., $d_K$), where K is a source block length. Likewise, we will denote the DSDB as a vector d̂=($\hat{d}_1$, $\hat{d}_2$, ..., $\hat{d}_K$). Typically, both the SDB d and the DSDB d̂ will be vectors over a common alphabet. We will represent the TCB as a vector x=($x_1$, $x_2$, ..., $x_N$), where N is a code block length. After the encoder 110 encodes the SDB d into the TCB x, the TCB x is transmitted over the channel 120 by N successive uses of the channel 120 and the channel produces the RCB y=($y_1$, $y_2$, ..., $y_N$) with a certain probability.

For purposes of analyzing the communication system 100, we will use a probabilistic set-up and model the various signals in the system as samples of random signals. In particular, we will regard the SDB d, TCB x, RCB y, and DSDB d̂ as samples of D, X, Y, and D̂, respectively, and use the standard notation to denote their joint and conditional probabilities. For example, $P_{D,Y}(d, y)$ will denote the probability that D=d and Y=y, and $P_{Y|D}(y|d)$ will denote the conditional probability that Y=y given D=d. Unless otherwise specified, we will assume that $P_D(d)$ is the uniform distribution over the range of possible values of the SDB d.

Using the probabilistic set-up, the FER Pr (d̂≠d) for the communication system 100 is computed using the formula $\Sigma_{(d,\hat{d}):\hat{d} \ne d} P_{D,\hat{D}}(d,\hat{d})$. If the encoder 110 and the channel 120 are given, the FER depends on the decoder 130. An important type of decoder is the maximum-likelihood (ML) decoder, which sets the DSDB a to the value d' that maximizes $P_{Y|D}(y|d')$. Under the assumption that $P_D(d)$ is the uniform, the ML decoder minimizes the FER. In general, ML decoders are too complex to implement; they mainly serve as benchmarks for assessing the best achievable performance by other more practical decoders.

An important channel model is the discrete memoryless channel (DMC) model. A DMC is characterized by its input alphabet X, output alphabet Y, and transition probabilities W(y|x) for $x \in X$, $y \in Y$. The transition probability W(y|x) is the conditional probability that $y \in Y$ is received at the channel output given that $x \in X$ is sent at the channel input. A DMC is memoryless in the sense that the conditional probability of receiving an output block y=($y_2$, ..., $y_N$)$\in Y^N$ given that an input block x=($x_1$, $x_2$, ..., $x_N$)$\in X^N$ is sent is given by a product-form expression $W^N(y|x)=\Pi_{i=1}^N W(y_i|x_i)$. In the following, we will restrict attention to DMC models with X=$F_q$, with q=2 being the most important case. Note that the DMC channel model for the channel 120 defines part of the probabilistic model for the communication system 100 by the equation $P_{Y|X}(y|x)=W^N(y|x)$.

We will use the term code to refer to the mapping d→x from the SBD d to the TCB x. The encoder 110 and the decoder 130 are designed to encode and decode a specific code. There are many types of codes in the prior art, such as convolutional codes and polar codes. The present disclosure introduces a new family of codes called triangular factorization (TF) codes. TF codes will be introduced as a subclass of a broader family of codes that we now define.

Transform codes. A transform code over a finite field $\mathbb{F}_q$ is a code characterized by a transform matrix $G \in \mathbb{F}_q^{N \times N}$ a data index set $\mathcal{A}$, and a frozen data block (FDB) $a \in \mathbb{F}_q^{N-K}$, wherein N is the code block length, K is the source block length, the data index set $\mathcal{A}$ is a subset of $\{1, 2, \ldots, N\}$ with cardinality $|\mathcal{A}|=K$, and the FDB a is a fixed but arbitrary vector. Throughout the following $\mathcal{A}^c$ will denote the complement of the data index set $\mathcal{A}$ in $\{1, 2, \ldots, N\}$. An encoder for the transform code with parameters (G, $\mathcal{A}$, a) maps the SDB $d \in \mathbb{F}_q^K$ to the TCB $x \in \mathbb{F}_q^N$ whereby $x=vG$, wherein $v \in \mathbb{F}_q^N$ is a data container block (DCB) comprising of a data part $v_{\mathcal{A}} = d$ and a frozen part $v_{\mathcal{A}^c} = a$. The decoding task for transform codes is to estimate the SDB d based on knowledge of the RCB y and the FDB a.

The decoding of a transform code can be thought of as consisting of two steps. The first step is to produce the DDCB $\hat{v}$ by processing the RCB y; the second step is to obtain the DSDB $\hat{d}$ by setting $\hat{d}=\hat{v}_{\mathcal{A}}$. (These two steps may be carried out simultaneously in implementing a decoder to save time and reduce equipment complexity.) An ML decoder for a transform code may carry out the first step of the above procedure by calculating the DDCB $\hat{v}$ by maximizing $P_{Y|V}(y|v)$ over $v \in \mathbb{F}_q^N$ subject to the constraint $v_{\mathcal{A}^c} = a$.

Relation to polar codes. It will be clear to the person skilled in the art of polar coding that polar codes are a subclass of transform codes. In particular, the standard polar code over $\mathbb{F}_2$ is a transform code with parameters (G, $\mathcal{A}$, a) wherein $G=F^{\otimes n}$ with $$F = \begin{bmatrix} 1 & 0 \\ 1 & 1 \end{bmatrix},$$

$\mathcal{A}$ is chosen with respect to an information-theoretic criterion such as mutual information, and a is typically set to the all-zero vector 0.

Relation to linear codes. A transform code with parameters (G, $\mathcal{A}$, a) for which the FDB a is an all-zero vector, a=0, reduces to a linear code, which is a very broad and well-known class of codes in the prior art. For a linear code, the SDB d and the TCB x are related by $x=dG'$ for a generator matrix $G' \in \mathbb{F}_q^{K \times N}$. The generator matrix $G'$ of the linear code corresponding to a transform code (G, $\mathcal{A}$, a=0) is given by $G'=G_{\mathcal{A}}$ where $G_{\mathcal{A}} \in \mathbb{F}_q^{K \times N}$ is defined as the matrix obtained from G by deleting the ith row of G for each $i \in \mathcal{A}^c$. In general, the encoder mapping defined by a transform code (G, $\mathcal{A}$, a) has the form $x=dG'+b$ wherein $G'=G_{\mathcal{A}}$ and $b=aG_{\mathcal{A}^c}$. Conversely, given a linear code with a generator matrix $G'$, one may construct an equivalent transform code (G, $\mathcal{A}$, a=0) by selecting G as any matrix such that $G_{\mathcal{A}}=G'$.

Complexity considerations. We note that using an encoder for a transform code to implement the encoding of an equivalent linear code may reduce encoding complexity significantly. A direct implementation of the mapping $x=dG'$ (as a vector-matrix product) for a given linear code may be more complex than computing an equivalent transform $x=vG$ with $v_{\mathcal{A}}=d$, $v_{\mathcal{A}^c}=0$, and $G_{\mathcal{A}}=G'$. While $G'$ may lack any structure that can be exploited in computing $x=dG'$, it may be possible to build a computationally useful structure into the transform matrix G by using the additional degrees of freedom available in the choice of the parameters $\mathcal{A}$ and $G_{\mathcal{A}^c}$. For example, in the case of standard polar codes with $G=F^{\otimes n}$, $$F = \begin{bmatrix} 1 & 0 \\ 1 & 1 \end{bmatrix},$$

the complexity of computing the transform $x=vG$ is O(N log N), while computation of $x=dG_{\mathcal{A}}$ without exploiting the structure in G takes O(NK) steps, which may be significantly higher than O(N log N). The present principles aim to find transform codes (G, $\mathcal{A}$, a) that can be encoded and decoded at low-complexity by exploiting specially designed structures in the transform matrix G while providing a performance advantage over codes of comparable dimensions in the prior art. The present principles exploit triangular factorizations of matrices to achieve these goals.

Triangular factorizations. Triangular factorizations of matrices is a well-known topic in linear algebra over any field. We are concerned here with the triangular factorizations of the generator matrices G of transform codes. We will state a number of facts about such factorizations without proof. (For proofs, we refer to Section 3.5 of the book "Matrix Analysis, Cambridge University Press, 1985" by R. A. Horn and C. R. Johnson.)

Given a transform code with a generator matrix $G \in \mathbb{F}_q^{N \times N}$ (singular or non-singular), there exist an upper-triangular matrix $U \in \mathbb{F}_q^{N \times N}$ a lower-triangular matrix $L \in \mathbb{F}_q^{N \times N}$, and permutation matrices $P \in \mathbb{F}_q^{N \times N}$ and $Q \in \mathbb{F}_q^{N \times N}$ such that $G=PULQ$. If G is nonsingular, then there exists a unique factorization of the form $G=UDL$ such that $U \in \mathbb{F}_q^{N \times N}$ is an upper triangular matrix with 1s on the diagonal, $L \in \mathbb{F}_q^{N \times N}$ is a lower-triangular matrix with 1s on the diagonal, and $D \in \mathbb{F}_q^{N \times N}$ is a diagonal matrix with non-zero diagonal entries. In particular, if G belongs to $\mathbb{F}_2^{N \times N}$ (the binary case) and is non-singular, then there exists a unique factorization $G=UL$ where $U \in \mathbb{F}_2^{N \times N}$ is an upper-triangular matrix (with is on the diagonal) and $L \in \mathbb{F}_2^{N \times N}$ is a lower-triangular matrix (with 1s on the diagonal).

Triangular factorizations are used in linear algebra as efficient methods for solving systems of linear equations. The present principles carry triangular factorization methods to the domain of error correction coding. In the following, we will use the term triangular factorization (TF) code with parameters ($G_{out}$, $G_{in}$, $\mathcal{A}$, a) as a more specific way to refer to a transform code (G, $\mathcal{A}$, a) when $G_{out}$, $G_{in}$, and G are related by a triangular factorization of the form $G=G_{out}G_{in}$. Each triangular factorization $G=G_{out}G_{in}$ of the transform matrix of a transform code (G, $\mathcal{A}$, a) will define a corresponding triangular factorization code. Triangular factorizations are of interest mainly as templates for implementing the encoding or decoding functions in a communication system. The present principles have the goal of designing transform matrices G with triangular factorizations $G=G_{out}G_{in}$ so that the resulting transform code provides sufficiently reliable data transmission while at the same time having low-complexity encoding and decoding procedures that exploit special structures designed into $G_{out}$ and $G_{in}$. The present principles in their preferred embodiments will illustrate how this can be done.

Figure 2:
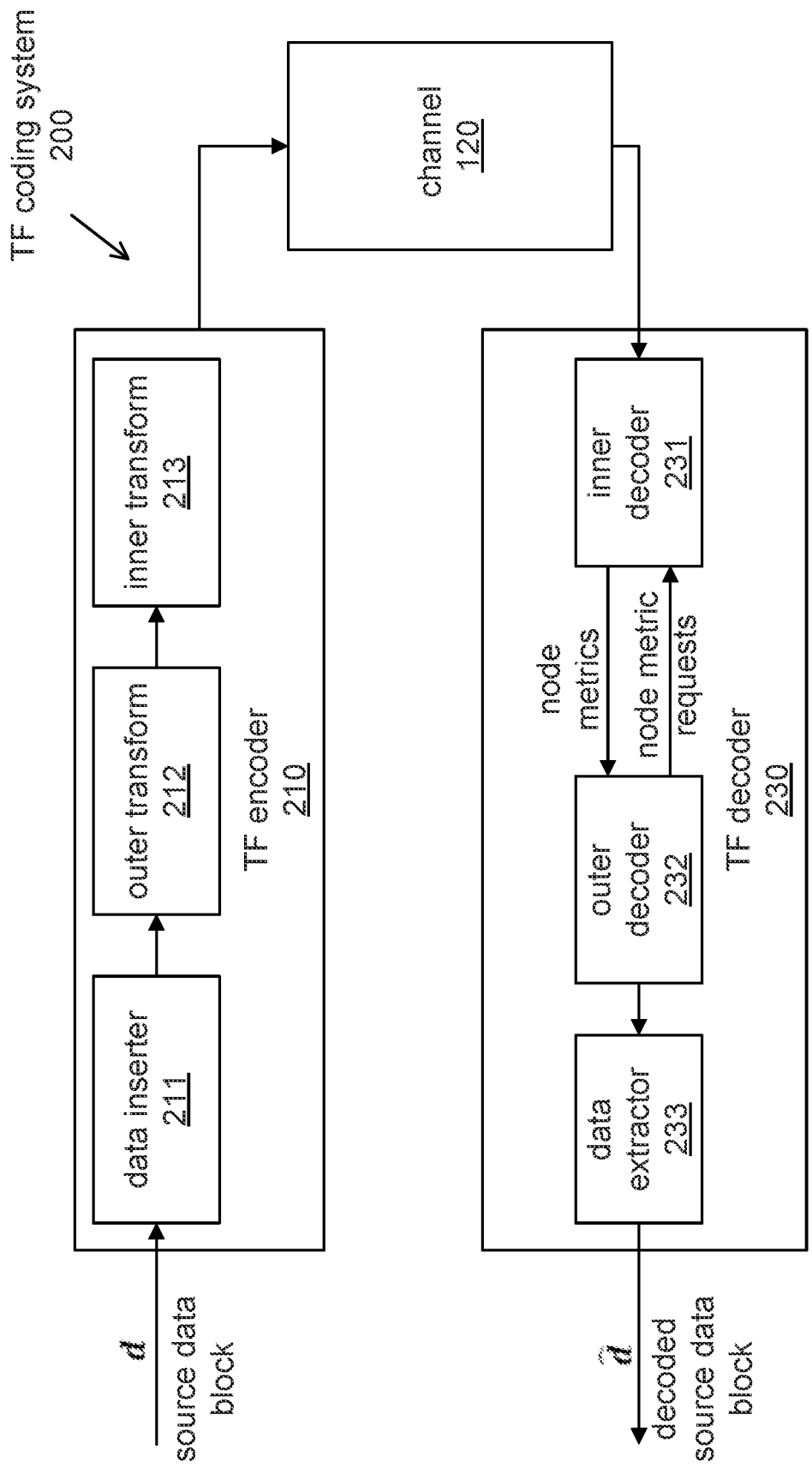
FIG. 2 is a functional block diagram of a communication system employing triangular factorization coding in accordance with embodiments of the present disclosure.

Turning to FIG. 2, we see a block diagram showing a TF coding system 200, wherein the TF coding system 200 is an adaptation of the communication system 100 to encoding and decoding of a TF code ($G_{out}$, $G_{in}$, $\mathcal{A}$, a), wherein $G_{out}$ is an outer transform matrix, $G_{in}$ is an inner transform matrix, A is a data selector set, and a is a frozen data block (FDB). The TF coding system 200 comprises a TF encoder 210, the channel 120 (which is the same as in FIG. 1), and a TF decoder 230. The TF encoder 210 comprises a data inserter 211, an outer transform 212, and an inner transform 213, wherein the data inserter 211 receives the SDB d and generates a data container block (DCB) v so that $v_{\mathcal{A}}$ =d and $v_{\mathcal{A}^c}$ =a. The outer transform 212 receives the DCB v and generates an outer transform block (OTB) u whereby u G=v $G_{out}$. The inner transform 213 receives the OTB u and generates the TCB x whereby x=u $G_{in}$. The TF encoder 210 sends the TCB x to the channel 120. The channel 120 receives the TCB x and, in response, produces the received code block (RCB) y at the channel output. The TF decoder 230 comprises an inner decoder 231, an outer decoder 232, and a data extractor 233. The TF decoder 230 receives the RCB y from the channel output and passes it to the inner decoder 231. The inner decoder 231 and the outer decoder 232 exchange messages with each other over a message interface. In response to each node metric request sent by the outer decoder 232 over the message interface, the inner decoder 231 computes a node metric and sends the node metric to the outer decoder 232 over the message interface. Each node metric is a function of a plurality of variables, the plurality of variables comprising a node identifier and the RCB y. The outer decoder 232 receives the node metrics generated by the inner decoder 231, computes a decoded data container block (DDCB) V̂, and passes the DDCB v̂ to the data extractor 233. The data extractor 233 receives the DDCB and extracts the DSDB d̂ by setting d̂=v̂$_{\mathcal{A}}$. In a well-designed TF coding system, the DSDB d is an exact replica of the SDB d with high probability.

An important aspect of the TF coding system 200 is its modular structure in the sense that it is possible to implement the inner decoder 231 and outer decoder 232 independently of each other. More precisely, the inner decoder 231 may be implemented independently of the outer transform $G_{out}$ and the outer decoder 232 may be implemented independently of the inner transform $G_{in}$. Having such modularity in the implementation of the TF decoder 230 is advantageous because one can change the inner transform or the outer transform without having to redesign all parts of the TF decoder 230. In the following, we will discuss in greater detail each part of the TF coding system 200 and present exemplary embodiments for each part.

FIG. 3 shows an exemplary data inserter 300, wherein the exemplary data inserter 300 is a digital logic circuit implementing the data inserter 211 for the specific case N=8, $\mathcal{A}$ ={4,6,7,8}, and a=($a_1$ $a_2$, $a_3$, $a_4$). Accordingly, the exemplary data inserter 300 generates the DCB v=($v_1$, $v_2$, . . . , $v_8$) from the SDB d=($d_1$, $d_2$, $d_3$, $d_4$) so that $v_1$=$a_1$, $v_2$=$a_2$, $v_3$=$a_3$, $v_4$=$d_1$, $v_5$=$a_4$, $v_6$=$d_2$, $v_7$=$d_3$, and $v_8$=$d_4$. The exemplary data inserter 300 comprises an SDB register 301 for receiving and storing the SDB d, an FDB register 302 for storing the FDB a, and a DCB register 303 for forming and storing the DCB v. The operation of the exemplary data inserter 300 comprises three steps. In the first step, the SDB d is loaded serially into the SDB register 301 under control of a clock (not shown in the figure). In the second step, the SDB d and the FDB a are loaded from their respective registers 301 and 302 in parallel into the DCB register 303. In the third step, the DCB i is shifted serially out of the DCB register 303. It will be clear to the person skilled in the art that there are many other alternative implementations of a data inserter function corresponding to a given pair of parameters (N, $\mathcal{A}$, a) using digital circuits or stored program computers. For example, parallel logic operations may be used instead of serial operations where latency is important.

The data inserter 211 can be implemented also on general purpose processors, which may be a better option when it is desired that the data inserter 211 be reconfigurable to different settings of the parameters (N, $\mathcal{A}$, a). Turning to FIG. 4, we see an exemplary data inserter algorithm 400 for implementing the data inserter 211 using a general purpose stored program computer, wherein the algorithm 400 is a sequence of instructions written in pseudo-code and is reconfigurable to operate with any given set of parameters (N, $\mathcal{A}$, a), wherein N is the code block length, A is the data index set, and a is the FDB. The algorithm 400 receives as input the SDB d and produces as output the DCB v whereby that $v_{\mathcal{A}}$ =d and $v_{\mathcal{A}^c}$ =a. The person skilled in the art will have no difficulty in implementing the data inserter 211 on a stored program computer following the logic of the exemplary data inserter algorithm 400.

The data index set $\mathcal{A}$. The performance of a TF code depends critically on the choice of the data index set $\mathcal{A}$. Since the choice of the data index set $\mathcal{A}$ is a one-time design problem, the complexity of finding an optimal or near-optimal $\mathcal{A}$ is not a major concern. Still, an exhaustive search for the best data index set $\mathcal{A}$ is not feasible given the exponential size of the search space. The present principles can be used with any method for choosing the data index set $\mathcal{A}$; however, a preferred method of constructing the data index set $\mathcal{A}$ is the score function approach.

Score functions. Let $\mathcal{A}$ be a set that is admissible as a data index set, i.e., let $\mathcal{A}$ be such that $\mathcal{A} \subset \{1, 2, \ldots, N\}$ and $|\mathcal{A}|$=K. A score function associated with $\mathcal{A}$ is any function $s_{\mathcal{A}}$ : $\{1, 2, \ldots, N\} \rightarrow \mathbb{R}$ (real numbers) that assigns a real number (a score) to each index i∈{1, 2, . . . , N}. In the score function approach, the data index set is chosen as an admissible $\mathcal{A}$ such that the minimum of $s_{\mathcal{A}}$(i) over all i∈$\mathcal{A}$ is as large as possible. In other words, in the score function approach, we seek to solve the optimization problem $$\max_{\mathcal{A}} \min_{i \in \mathcal{A}} s_{\mathcal{A}}(i)$$

where the maximum is over all admissible $\mathcal{A}$. Score functions defined below assume that the coordinates of the DCB v will be decoded in the natural order from 1 to N at the TF decoder 230. The person skilled in the art will have no difficulty in making appropriate changes to the score functions below if some other order of decoding is employed at the TF decoder 230.

We will consider two types of score functions: pointwise and windowed. Pointwise score functions have been used in the prior art for constructing polar codes and Reed-Muller codes. Windowed score functions are a novel approach. Both types of score functions can be used in conjunction with the present principles to improve the prior art. We first give three examples of pointwise score functions.

The Hamming score function is defined as $s_{\mathcal{A}}$ (i)=$w_H$(i−1)−$\chi_{\mathcal{A}}$ (i) where $W_H$ is the Hamming weight of an integer (defined below) and $\chi_{\mathcal{A}}$ is the indicator function of the set $\mathcal{A}$ (i.e., $\chi_{\mathcal{A}}$ (i)=1 if i∈$\mathcal{A}$ and $\chi_{\mathcal{A}}$ (i)=0 if i∉$\mathcal{A}$). The Hamming weight of an integer k≥0 is defined as $w_H(k)=\sum_{j=0}^{n-1} b_j$, where $b_0, b_1, \ldots, b_{n-1} \in \mathbb{F}_2$ are the coefficients in the binary representation $k=\sum_{j=0}^{n-1} b_j 2^j$. For example, $w_H(13)=3$ since $13=1+2^2+2^3$. The Hamming score function has the property of being independent of the parameters of the channel 120. The person skilled in the art will recognize that the Hamming score function produces Reed-Muller codes for the special case of a transform code with $G=F^{\otimes n}$, $$F = \begin{bmatrix} 1 & 0 \\ 1 & 1 \end{bmatrix}.$$

Reed-Muller codes have the largest possible minimum Hamming distance over all codes of a given rate when $G=F^{\otimes n}$. Minimum Hamming distance is an important parameter in determining the FER performance of codes at high signal-to-noise-ratios. In a simulation study reported below, we will see that the Hamming score function, when it is used as part of the present principles, produces a FER performance that improves the prior art in polar coding and Reed-Muller coding.

The mutual-information score function is defined as $s_{\mathcal{A}}(i)=I(Y; V_i|V^{i-1})-\chi_{\mathcal{A}}(i)$, where $$I(Y; V_i | V^{i-1}) = \sum_{y,v^i} P_{Y,V^i}(y, v^i) \log \frac{P_{Y|V^i}(y|v^i)}{P_{Y|V^{i-1}}(y|v^{i-1})}$$

is the conditional mutual information between $V_i$ and $Y$ given $V^{i-1}$. Here, $V_i$ is the random variable corresponding to the ith coordinate of the DCB v, $V^{i-1}$ is the random vector associated with the initial segment $v^{i-1}$ of the DCB v, $V^i=(V^{i-1}, V_i)$, and Y is the random vector corresponding to the RCB y. The skilled person in the art will recognize that the mutual-information score function produces the standard polar codes for the special case of a transform code with $G=F^{\otimes n}$, $$F = \begin{bmatrix} 1 & 0 \\ 1 & 1 \end{bmatrix}.$$

The Gallager score function is defined as $s_{\mathcal{A}}(i)=E_\rho(Y; V_i|V^{i-1})-\chi_{\mathcal{A}}(i)$, where $$E_\rho(Y; V_i | V^{i-1}) =$$
$$-\frac{1}{\rho}\log_2 \sum_{y,v^{i-1}} P_{V^{i-1}}(v^{i-1}) \left\{ \sum_{v_i} P_{V_i|V^{i-1}}(v_i|v^{i-1}) P_{Y|V^i}(y|v^i)^{1/1+\rho} \right\}^{1+\rho}$$

where $\rho>0$ is a free parameter (for each value of $\rho$, we have a different score function). For a discussion of the significance of the Gallager function and its properties, we refer to R. Gallager, "A simple derivation of the coding theorem and some applications," IEEE Transactions on Information Theory, vol. 11, no. 1, pp. 3-18, January 1965". The function $E_\rho(Y; V_i|V^{i-1})$ is a generalized conditional information. As $\rho \to 0$, we have $E_\rho(Y; V_i|V^{i-1}) \to I(Y; V_i|V^{i-1})$, so the Gallager score function contains the mutual-information score function as a special case. Another important special case of the Gallager score function occurs with $\rho=1$. We have $E_1(Y; V_i|V^{i-1})=R_0(Y; V_i|V^{i-1})$, where $R_0(Y; V_i|V^{i-1})$ is a conditional cutoff rate. The Gallager score function places more emphasis on the code minimum distance as $\rho$ increases.

The computation of the above score functions is facilitated when the outer transform $G_{out}$ is an upper-triangular non-singular matrix. In that case, the inverse of $G_{out}$ is also non-singular and upper-triangular and the initial segments $v^i$ of the DCB v and $u^i$ of the OTB u are related to each other in a one-to-one manner. Hence, $E_\rho(Y; V_i|V^{i-1})=E_\rho(Y; U_i|U^{i-1})$. Density-evolution techniques can be used to compute $E_\rho(Y; U_i|U^{i-1})$ efficiently when the inner transform has sufficient structure, e.g., when $G_{in}=F^{\otimes n}$ with $$F = \begin{bmatrix} 1 & 0 \\ 1 & 1 \end{bmatrix}.$$

The above score functions are pointwise in the sense that $s_{\mathcal{A}}(i)$ is defined as the difference of two functions, a pointwise resource function $q(i)$ and a pointwise rate function $\chi_{\mathcal{A}}(i)$. The pointwise resource value $q(i)$ depends on the particular triangular factorization $G=G_{out}G_{in}$ used in the code construction, but is independent of $\mathcal{A}$. The pointwise rate $\chi_{\mathcal{A}}(i)$ depends only on $\mathcal{A}$. The value $s_{\mathcal{A}}(i)$ may be interpreted as the difference between an available resource (information available at time i) and a demand (transmission of a source data bit at time i). We choose $\mathcal{A}$ so as to minimize the shortage of resources. Pointwise score functions are meaningful when decisions are made sequentially one and for all for each bit in the sequence, with no backtracking or look-ahead into the future. Since the present principles are based on using a powerful tree search algorithm as part of an outer code, pointwise score functions are sub-optimal for the present principles. There is need for score functions that can match the score to the characteristics of the search algorithm. The windowed score functions that are introduced next serve this purpose.

For every score function $s_{\mathcal{A}}(i)=q(i)-\chi_{\mathcal{A}}(i)$ we define a windowed version of $s_{\mathcal{A}}(i)$ as $S_{\mathcal{A}}(i; k, m)=\sum_{j=-k}^{m} w_j s_{\mathcal{A}}(i+j)$ where $k\geq 0$ (a fixed integer) is a lag parameter, $m\geq 0$ (a fixed integer) is a lead parameter, and $w_j>0$ (fixed real numbers) are weight parameters. We extend the definition of $s_{\mathcal{A}}(i)$ to all integers by setting $s_{\mathcal{A}}(i)=0$ for $i\leq 0$ or $i>N$. The window length for a windowed score function $S_{\mathcal{A}}(i; k, m)$ with lag k and lead m is defined as k+m+1. When we speak of a windowed score function, we implicitly assume that the window length is greater than one. We do not put an upper bound on how large the window length can be. If TF coding with an upper-triangular Toeplitz $G_{out}$ is used, the window length may be on the same order as the span of the non-zero portion of the first row of $G_{out}$.

The index set design problem with a windowed score function is the problem of finding an admissible data index set $\mathcal{A}$ so that the minimum of $S_{\mathcal{A}}(i; k, m)$ over all $i \in \mathcal{A}$ is maximized.

Clearly, the windowed score functions contain the pointwise score functions as a special case with k=0, m=0, and $w_j=1$. The motivation for having a non-zero lag and lead is the idea that a search method equipped with a backtracking mechanism will carry out a search within a window of possible choices in a present search neighborhood. Thus, an algorithm for selecting a data index set should pay attention to keeping the ambiguity (source uncertainty minus the channel information) small over a search window rather than at particular decision points.

The above score functions are given for illustrating the general idea that the choice of a data index set is a significantly different optimization problem than that in polar coding. The skilled person in the art will be able to design other score functions to serve the same purposes. All such extensions of the exemplary score function methods presented above fall within the scope of the present disclosure.

The outer transform $G_{out}$. The complexity of computing the outer transform $u=vG_{out}$ is $O(N^2)$ for a general matrix $G_{out} \in \mathbb{F}_q^{N \times N}$, which is prohibitively complex in many applications even for moderate values of N. The present principles recognize that it is important to reduce the complexity of the outer transform by imposing a structure on $G_{out}$. To that end, in preferred embodiments of the present principles, we will restrict $G_{out}$ to be an upper-triangular Toeplitz matrix, characterized by an impulse response $c=(c_0, c_1, \ldots, c_m) \in \mathbb{F}_q^m$ with $c_0 \neq 0$, and $c_m \neq 0$, wherein m is an integer satisfying $1 \leq m \leq N-1$. The assumption $c_0 \neq 0$ ensures that the outer transform matrix $G_{out}$ has non-zero diagonal entries, which in turn ensures that $G_{out}$ is nonsingular. The assumption $c_m \neq 0$ for some $m \geq 1$ ensures that $G_{out}$ is a strictly upper-triangular matrix. By using a strictly upper-triangular outer transform matrix $G_{out}$, we guarantee that the outer transform 212 is a non-trivial operation, which in turn ensures that TF codes in their preferred embodiments do not coincide with certain other codes, such as polar codes, in the prior art. An exemplary outer transform matrix under the above condition is $$G_{out} = \begin{bmatrix} 1 & 1 & 0 & 1 & 0 & 0 & 0 & 0 \\ 0 & 1 & 1 & 0 & 1 & 0 & 0 & 0 \\ 0 & 0 & 1 & 1 & 0 & 1 & 0 & 0 \\ 0 & 0 & 0 & 1 & 1 & 0 & 0 & 0 \\ 0 & 0 & 0 & 0 & 1 & 1 & 0 & 1 \\ 0 & 0 & 0 & 0 & 0 & 1 & 1 & 0 \\ 0 & 0 & 0 & 0 & 0 & 0 & 1 & 1 \\ 0 & 0 & 0 & 0 & 0 & 0 & 0 & 1 \end{bmatrix},$$

which corresponds to the impulse response $c=(c_0, c_1, c_2, c_3)=(1,1,0,1)$. When $G_{out}$ is defined as an upper-triangular Toeplitz matrix with an impulse response c, the outer transform operation $u=vG_{out}$ can be expressed as a convolution so that $u_i = c_0 v_i + c_1 v_{i-1} + \ldots c_j v_{i-j} + \ldots + c_m v_{i-m}$ for all $i=1, 2, \ldots, N$, where we interpret $v_{i-j}$ as 0 if $i-j \leq 0$. Thus, the outer transform 212 may be seen as a discrete-time linear time-invariant filter; and the vector c can be interpreted as the impulse response of the linear time-invariant filter (response to the input $v=(1, 0, \ldots, 0)$). It will be known to the person skilled in the art that there are many practical methods of implementing a convolution operation corresponding to an upper-triangular Toeplitz matrix $G_{out}$.

Figure 5:
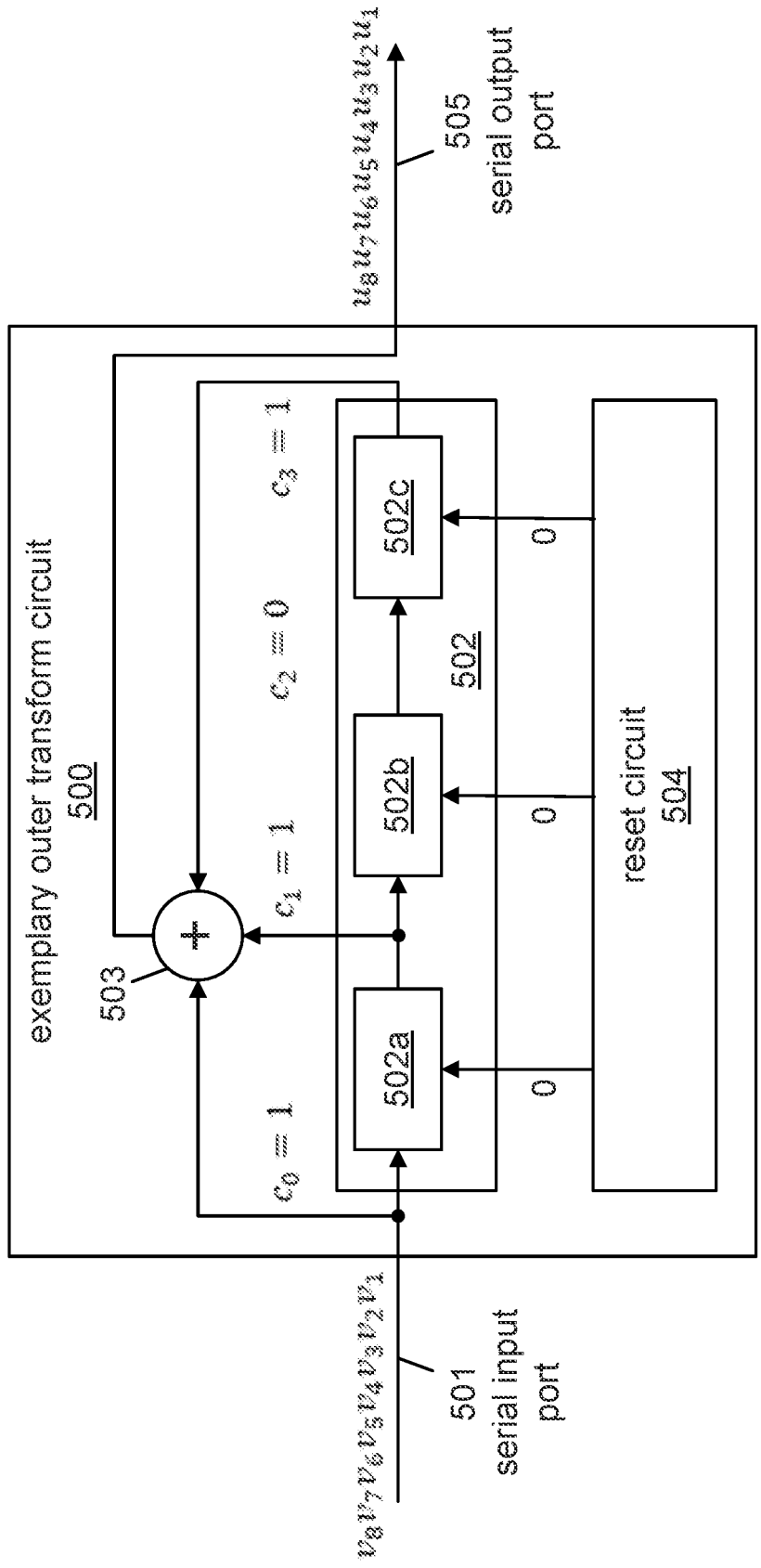
FIG. 5 is an exemplary outer transform for use in a communication system employing error correction coding in accordance with embodiments of the present disclosure.

FIG. 5 displays an exemplary outer transform circuit 500 that implements the transform $u=vG_{out}$ for the special case where $G_{out}$ is an upper-triangular Toeplitz matrix defined by the impulse response $c=(1,1,0,1)$. The exemplary outer transform circuit 500 comprises a serial input port 501, a shift-register 502, a modulo-2 adder 503, a reset circuit 504, and a serial output port 505. The exemplary outer transform circuit 500 uses sequential logic, which requires additional signals such as clock and control logic. These additional signals are not shown in FIG. 5 in order not to clutter the diagram with unnecessary detail. The person skilled in the art will have no difficulty in providing the missing details. The shift-register 502 comprises three registers connected in tandem, a first register 502a, a second register 502b, and a third register 502c. Each shift register 502a, 502b, 502c can hold one bit, which is either 0 or 1. The modulo-two adder 503 computes the modulo-2 sum (equivalently the exclusive-or (XOR)) of the logic signals at the input port 501, the output of the first register 502a, and the output of the third register 502c. The logic signal at the output of register 502b is excluded from the modulo-2 sum because $c_2=0$. Initially, with the rising edge of the first clock tick, the contents of the shift register 502 are initialized to 0 by the reset circuit 504 and the first bit $v_1$ of the DCB v appears as a valid logic signal at the serial input port 501. With the rising edge of the second clock tick, the modulo-2 adder 503 computes the first bit $u_1$ of the OTB u and sends it out at the serial output port 505, the first bit $v_1$ is shifted into the first register 502a, the content of the first register 502a moves into the second register 502b, the content of the second register 502b moves into the third register 502c, and the second bit $v_2$ of the DCB v appears as a valid logic signal at the serial input port 501. Thus, before the rising edge of the third clock tick, the contents of the shift register 502 read ($v_1$, 0,0) and the second bit $v_2$ of the DCB v is available at the serial input port 501 for the next round of modulo-2 addition. The operation of the exemplary outer transform circuit 500 continues in this manner, producing $u_1=v_1$, $u_2=v_1+v_2$, $u_3=v_2+v_3$, $u_4=v_1+v_3+v_4$, $u_5=v_2+v_4+v_5$, $u_6=v_3+v_5+v_6$, $u_7=v_4+v_6+v_7$, and $u_8=v_5+v_7+v_8$. For example, if $v=(1,1,0,0,1,0,1,1)$, then $u=(1, 0,1,1,0,1,1,1)$. As the eighth bit $u_8$ of the OTB u is sent out at the serial output port 505, the reset circuit 504 is activated and the circuit becomes ready for accepting the next DCB. It takes exactly 8 clock ticks to complete one round of the outer transform operation. The exemplary outer transform circuit 500 can operate without time gaps between outer transform operations on successive DCBs.

Following the model of the exemplary outer transform circuit 500, one can readily implement a general convolution operation corresponding to any upper triangular Toeplitz matrix. If the DCB v is N-dimensional and the impulse response is of the form $c=(c_0, c_1, \ldots, c_m)$, then a shift register with m stages is required and it takes N clock cycles to complete one round of the outer transform operation.

The person skilled in the art will know that the method of computing a convolution as presented in FIG. 5 is well known and that there are many alternative circuits for computing a convolution, such as circuits using parallel processing and/or pipelining in order to improve data throughout or decrease latency.

The inner transform $G_{in}$. The inner transform operation $x=uG_{in}$ has complexity $O(N^2)$ for a general matrix $G_{in} \in \mathbb{F}_q^{N \times N}$, which may be prohibitive for practical implementations. The present principles aim to reduce the complexity of the inner transform operation by imposing a structure on $G_{in}$. In preferred embodiments of the present principles, $G_{in}$ is restricted to have a Kronecker product form: $G_{in}=L_1 \otimes \ldots \otimes L_n$, where $L_i \in \mathbb{F}_q^{N_i \times N_i}$ is a lower-triangular matrix with $N_i \geq 2$ for each $i=1, 2, \ldots, n$. The resulting $G_{in}$ is a N-by-N lower-triangular matrix with $N=\Pi_{i=1}^n N_i$. If the Kronecker factors $L_1, \ldots, L_n$ of $G_{in}$ are chosen suitably, the complexity of computing the inner transform $x=uG_{in}$ can be reduced from $O(N^2)$ to $O(N \log N)$. For example, if $$L_i = F = \begin{bmatrix} 1 & 0 \\ 1 & 1 \end{bmatrix}$$

for each i=1, 2, . . . , n, then $G_{in}=F^{\otimes n}$ becomes the polar transform matrix in polar coding and the complexity of the inner transform reduces to $O(N \log_2 N)$. For completeness, we present below a circuit for implementing $x=uG_{in}$ for this important special case with $G_{in}=F^{\otimes n}$.

Figure 6:
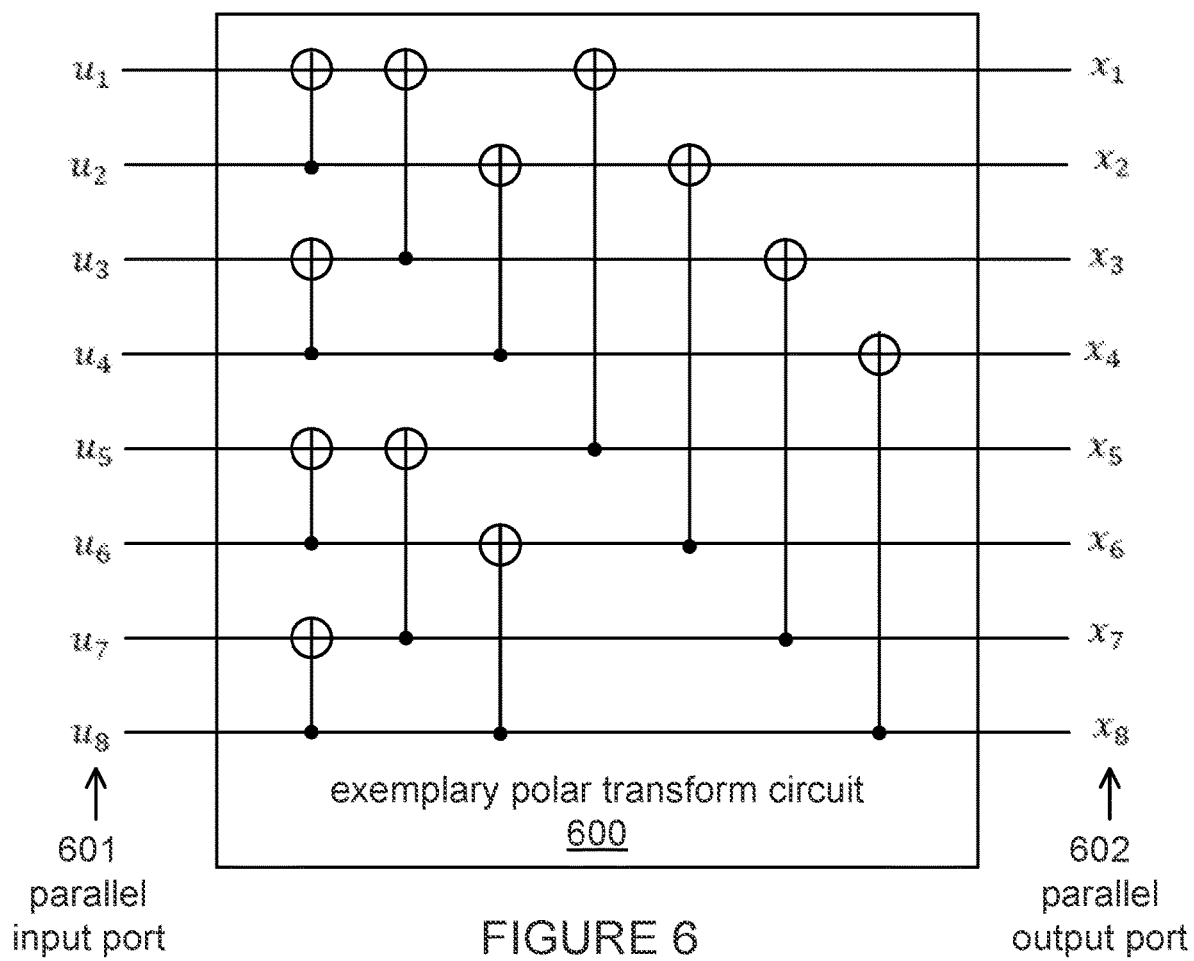
FIG. 6 is an exemplary polar transform circuit for use in a communication system employing error correction coding in accordance with embodiments of the present disclosure.

FIG. 6 shows an exemplary polar transform circuit 600 that can be used to implement the inner transform 213 in the special case where $$G_{in} = F^{\otimes 3} = \begin{bmatrix} 1 & 0 & 0 & 0 & 0 & 0 & 0 & 0 \\ 1 & 1 & 0 & 0 & 0 & 0 & 0 & 0 \\ 1 & 0 & 1 & 0 & 0 & 0 & 0 & 0 \\ 1 & 1 & 1 & 1 & 0 & 0 & 0 & 0 \\ 1 & 0 & 0 & 0 & 1 & 0 & 0 & 0 \\ 1 & 1 & 0 & 0 & 1 & 1 & 0 & 0 \\ 1 & 0 & 1 & 0 & 1 & 0 & 1 & 0 \\ 1 & 1 & 1 & 1 & 1 & 1 & 1 & 1 \end{bmatrix}.$$

The exemplary polar transform circuit 600 comprises a parallel input port 601, a parallel output port 602, and an internal logic circuit. The internal logic is combinational. The circuit is driven by input signals $(u_1, \ldots, u_8)$ applied at the parallel input port 601 and produces (after some signal propagation delay) output signals $(x_1, \ldots, x_8)$ at the parallel output port 602. By tracing the input logic signals through the circuit, it can be verified that the output signals are related to the input signals by $x_1=u_2 \oplus u_3 \oplus u_4 \oplus u_5 \oplus u_6 \oplus u_7 \oplus u_8$, $x_2=u_2 \oplus u_4 \oplus u_6 \oplus u_8$, $x_3=u_3 \oplus u_4 \oplus u_7 \oplus u_8$, $x_4=u_4 \oplus u_8$, $x_5=u_5 \oplus u_6 \oplus u_7 \oplus u_8$, $x_6=u_6 \oplus u_8$, $x_7=u_7 \oplus u_8$, and $x_8=u_8$, wherein $\oplus$ denotes the logic exclusive or (XOR) operation. These relations between the logic signals are the same as the algebraic relations one obtains between the vectors $u=(u_1, \ldots, u_8) \in \mathbb{F}_2^8$ and $x=(x_1, \ldots, x_8) \in \mathbb{F}_2^8$ by carrying out the matrix multiplication $x=uF^{\otimes 3}$ Thus, it is verified that the circuit 600 implements correctly the inner transform operation for the exemplary case $G_{in}=F^{\otimes 3}$. For generalization of the circuit 600 to the case $G_{in}=F^{\otimes n}$ with arbitrary n, we refer to the prior art on polar coding. The prior art on polar coding contains many options for implementing a polar transform using either hardware or software. All such implementation options can be used in physical realizations of the present principles.

We have presented exemplary implementation options for each individual part of the TF encoder 210. Next, we will present an embodiment of the TF encoder 210 that brings those parts together.

A preferred embodiment of TF encoder 210. In the preferred embodiment of the TF encoder 210, the TF code $(G_{out}, G_{in}, \mathcal{A}, a)$ is a code over a finite field $\mathbb{F}_q$, wherein the outer transform matrix $G_{out}$ is a nonsingular strictly upper-triangular Toeplitz matrix defined by an impulse response c; the inner transform matrix $G_{in}$ is a strictly lower-triangular matrix that has a Kronecker-product form $G_{in}=L_1 \otimes \ldots \otimes L_n$, wherein $n \geq 1$ and $L_i \in \mathbb{F}_q^{N_i \times N_i}$ is a lower-triangular matrix, having $N_i \geq 2$ rows (equivalently columns) for each i=1, 2, . . . , n; the data index set $\mathcal{A}$ and the FDB a are left arbitrary. The preferred embodiment of the TF encoder 210 takes can be implemented using the exemplary implementations in FIGS. 3, 4, 5, and 6.

We turn now to developing a suitable decoder for an arbitrary but fixed TF code $(G_{out}, G_{in}, \mathcal{A}, a)$ constructed in accordance with the preferred embodiment of the TF encoder 210. We observe that, since $G_{out}$ is an upper-triangular matrix, the mapping $u=vG_{out}$ from $v \in \mathbb{F}_q^N$ to $u \in \mathbb{F}_q^N$ is causal in the sense that $u^i=(u_1, \ldots, u_i)$ is determined by $v^i=(v_1, \ldots, v_i)$, for all $i \in \{1, 2, \ldots, N\}$. The causal nature of the outer transform $G_{out}$ makes it possible to represent the mapping $v \to u=vG_{out}$ in the form of a tree, which we call the outer transform (OT) tree. The OT tree has N+1 levels indexed by integers 0 to N. At level 0 of the OT tree, there is only a root node. At level $i \in \{1, 2, \ldots, N\}$ of the OT tree, there are $q^i$ nodes, with one node for each $v^i \in \mathbb{F}_q^i$. The nodes at the final level (level N) of the OT tree are called leaf nodes. There are $q^N$ leaf nodes in the OT tree, one for each $v \in \mathbb{F}_q^N$.

Next we show that the TF code is a tree code. Let us call a leaf node v in the OT tree admissible if $v \mathcal{A}^c = a$. There are $q^K$ admissible leaf nodes for a TF code $|\mathcal{A}|=K$. The code tree for the TF code $(G_{out}, G_{in}, \mathcal{A}, a)$ is defined as the subtree of the OT that one obtains after deleting all branches in the OT tree that do not lie on the path from the root to at least one admissible leaf node. The path in the code tree corresponding to the DCB v is called the correct path. Using the tree representation, the decoding task for a TF code may be seen as a search for the correct path through the TF code tree using the information provided by the RCB y. This viewpoint shows that various tree search algorithms can be adapted to the decoding task. For example, Viterbi decoding is derived from breadth-first search, sequential decoding from depth-first search with backtracking, successive-cancellation decoding from depth-first search without backtracking, and successive cancellation list decoding from beam search.

Having reformulated the task of the TF decoder 230 as a tree-search problem, we now turn our attention to the implementation of generic tree-search algorithms within the modular architecture of the TF decoder 230 shown in FIG. 2. Specifically, we discuss how the various tasks involved in a generic tree-search algorithm can be partitioned between the inner decoder 231 and the outer decoder 232. We will see that thanks to the upper-triangular form of the outer transform $G_{out}$ such a partition is possible. We begin by recalling from linear algebra that the inverse of a non-singular upper-triangular matrix is also upper-triangular. Hence, the inverse mapping $v=u(G_{out})^{-1}$ is causal in the same sense that the forward mapping $u=vG_{out}$ is causal. In other words, the prefixes $v^i=(v_1, \ldots, v_i)$ and $u^i=(u_1, \ldots, u_i)$ uniquely determine each other for each $i \in \{1, 2, \ldots, N\}$ and either prefix can be used to identify the nodes in the OT tree uniquely. Thanks to this property, the metric traffic across the interface between the inner decoder 231 and the outer decoder 232 can be carried out using the OTB prefixes $u^i$ as node identifiers. We will see below that passing metric request and metric value messages with OTB prefixes $u^i$ as node identifiers makes it possible to partition the tree-search tasks into modules as shown in FIG. 2.

A preferred embodiment of the TF decoder 230. In the preferred embodiment of the TF decoder 230, the constraints on the TF code parameters $(G_{out}, G_{in}, \mathcal{A}, a)$ are the same as in the preferred embodiment of the TF encoder and need not be specified separately. Thus, if the preferred embodiments of the TF encoder 210 and the TF decoder 230 are compatible with each other. In the preferred embodiment of the TF decoder 230, the outer decoder 232 uses a tree-search algorithm to search for the correct path through the OT tree, wherein the tree-search algorithm assesses the likelihood of a node $u^i$ being on the correct path by means of a node metric $\Gamma(u^i, y)$, wherein the node metric $\Gamma(u^i, y)$ is designed to drift up on the correct path and drift down on incorrect paths. The outer decoder 232 requests the calculation of a node metric $\Gamma(u^i, y)$ from the inner decoder 231 by presenting the node identifier $u^i$ to the inner decoder 232. Upon receiving such a request, the inner decoder 231 is responsible for computing the node metric $\Gamma(u^i, y)$. The metric $\Gamma(u^i, y)$ is designed to be such that it requires no knowledge of the outer code parameters ($G_{out}$, $\mathcal{A}$, a) so that the inner decoder 231 can be configured independently of the outer code. The outer decoder 232 uses the metric values received from the inner decoder 231 to carry out a tree search. At the end of the tree search, the inner decoder produces the DDCB $\hat{v}$ and passes the DDCB $\hat{v}$ to the data extractor 233. The data extractor 233 computes the DSDB $\hat{d}$ by setting $\hat{d}=\hat{v}\mathcal{A}$.

The scope of the preferred embodiment of the TF decoder 230 covers any tree-search algorithm and any node metric with the properties specified above. More specific choices for the search algorithm and the node metric are discussed below in preparation for the description of the most preferred embodiment of the TF decoder 230. We begin with the node metric.

The Fano metric. An exemplary node metric that can be used to implement the preferred embodiment of the TF decoder 230 is the Fano metric [FAN1963], defined as $$\Gamma(u^i, y) = \log_2 \frac{P_{Y|U^i}(y|u^i)}{P_Y(y)} - B_i$$

where $B_i$ is a bias term. In regular convolutional coding and sequential decoding, the bias term is constant; here, we allow the bias term to be time-varying. The reason for using a time-varying Fano metric is to ensure that the Fano metric maintains a positive drift $E[\Gamma(u^i, y)]$ on the correct path in the TF code tree despite the fact that the amount of information $$E\left[\log_2 \frac{P_{Y|U^i}(y|u^i)}{P_Y(y)}\right]$$

coming from the channel by way of the Fano metric is time-varying. The use of a Fano metric with a time-varying bias term is a feature that sets the present principles apart from the prior art.

In calculating the Fano metric, the inner decoder 231 makes an approximation by assuming that all paths in the OT code tree are admissible (ignoring that the TF code tree is a subtree of the OT tree), which amounts to assuming that the prefixes $U^i$ are equally likely over their $2^i$ possible values in the OT code tree. This approximation simplifies the calculation of the Fano metric and makes it independent of the details of the TF code. We leave it to the outer decoder 232 to apply a correction to the metric values received from the inner decoder 231 so that the tree-search does not deviate to paths that are not in the TF code tree.

The Fano metric can be computed incrementally by writing $\Gamma(u^i, y) = \sum_{j=1}^{i} \gamma(u_j, y|u^{j-1})$ where $$\gamma(u_j, y|u^{j-1}) = \log_2 \frac{P_{Y|U^j}(y|u^j)}{P_{Y|U^{j-1}}(y|u^{j-1})} - b_j$$

with $b_j = B_j - B_{j-1}$. For computational purposes, it may be more advantageous to use the Bayes' rule and the assumption that $$P_{U_j|U^{j-1}}(u_j|u^{j-1}) = 1/2,$$

and rewrite the branch metrics as $$\gamma(u_j, y|u^{j-1}) = \log_2 P_{U_j|Y, U^{j-1}}(u_j|y, u^{j-1}) - b_j + 1.$$

A preferred method of choosing the bias terms is to set $B_i = \alpha I(U^i; Y)$ for some constant $0 < \alpha < 1$. Then, the drift of the Fano metric at the ith node on the correct path equals $E[\Gamma(U^i, Y)] = (1-\alpha)I(U^i; Y)$, which is positive, as desired. When $B_i = \alpha I(U^i; Y)$, the branch metric bias terms become $b_j = \alpha I(U_j; Y|U^{j-1})$ and the expected values of the branch metrics along the correct path become $E[\gamma(u_j, y|u^{j-1})] = (1-\alpha)I(U_j; Y|U^{j-1})$, which are also positive. This discussion shows the need for having a time-varying bias term in applying the Fano metric in connection with a tree-search algorithm for decoding a TF code.

The skilled person in the art will recognize that, in the important special case where the inner transform $G_{in}$ is a polar transform $G_{in} = F^{\otimes n}$, the probability $$P_{U_j|Y, U^{j-1}}(u_j|y, u^{j-1})$$

can be computed at low-complexity using the method of successive cancellation decoding of polar codes. In fact, in this case, one has the formula $$P_{U_j|Y, U^{j-1}}(u_j|y, u^{j-1}) = \frac{W_N^{(j)}(y, u^{j-1}|u_j)}{W_N^{(j)}(y, u^{j-1}|0) + W_N^{(j)}(y, u^{j-1}|1)}$$

where $W_N^{(j)}$ denotes the jth bit channel created by the polar transform. Furthermore, in this case, the mutual information terms $I(U^i; Y)$ and $I(U_j; Y|U^{j-1})$ that appear in the recommended forms of the bias terms can be computed in complexity $O(N \log N)$ using the density-evolution technique for the design of polar codes.

We now specify in further detail how the metric messages are exchanged at the interface between the inner decoder 231 and the outer decoder 232. Suppose that the outer decoder is looking forward from a node $u^{i-1}$ in the TF code tree at some point during the execution of a tree search algorithm. If $i \in \mathcal{A}$, then there are two possible extensions $(u^{i-1}, 0)$ and $(u^{i-1}, 1)$ in the TF code tree of the node $u^{i-1}$, and the outer decoder 232 requests both node metrics, $\Gamma((u^{i-1}0), y)$ and $\Gamma((u^{i-1}1), y)$, from the inner decoder 231. If $i \notin \mathcal{A}$, then there is only one possible extension in the TF code tree of the node $u^{i-1}$, either $(u^{i-1}, 0)$ or $(u^{i-1}, 1)$, and the outer decoder 232 requests the node metric for the valid extension of the node $u^{i-1}$ and sets the node metric of the invalid extension of the node $u^{i-1}$ to $-\infty$.

As an option, the outer decoder may modify all received node metrics by applying an outer code specific and level specific bias to each received node metric. Such a procedure has been observed to yield improved results in simulations.

Sequential decoding. As mentioned above, sequential decoding is a decoding algorithm for convolutional codes developed by Wozencraft [WOZ1961]. Fano [FAN1963] developed a practical method of implementing sequential decoding that is especially suitable for hardware implementation. Zigangirov [ZIG1966] and Jelinek [JEL1969] developed a version of sequential decoder known as the stack decoder, which is easier to understand than Fano's algorithm but consumes considerably more memory resources. Both versions of sequential decoding can be used as a tree-search heuristic in implementing the outer decoder 232. Here, we will describe the stack decoder since it is much easier to explain.

Figure 7:
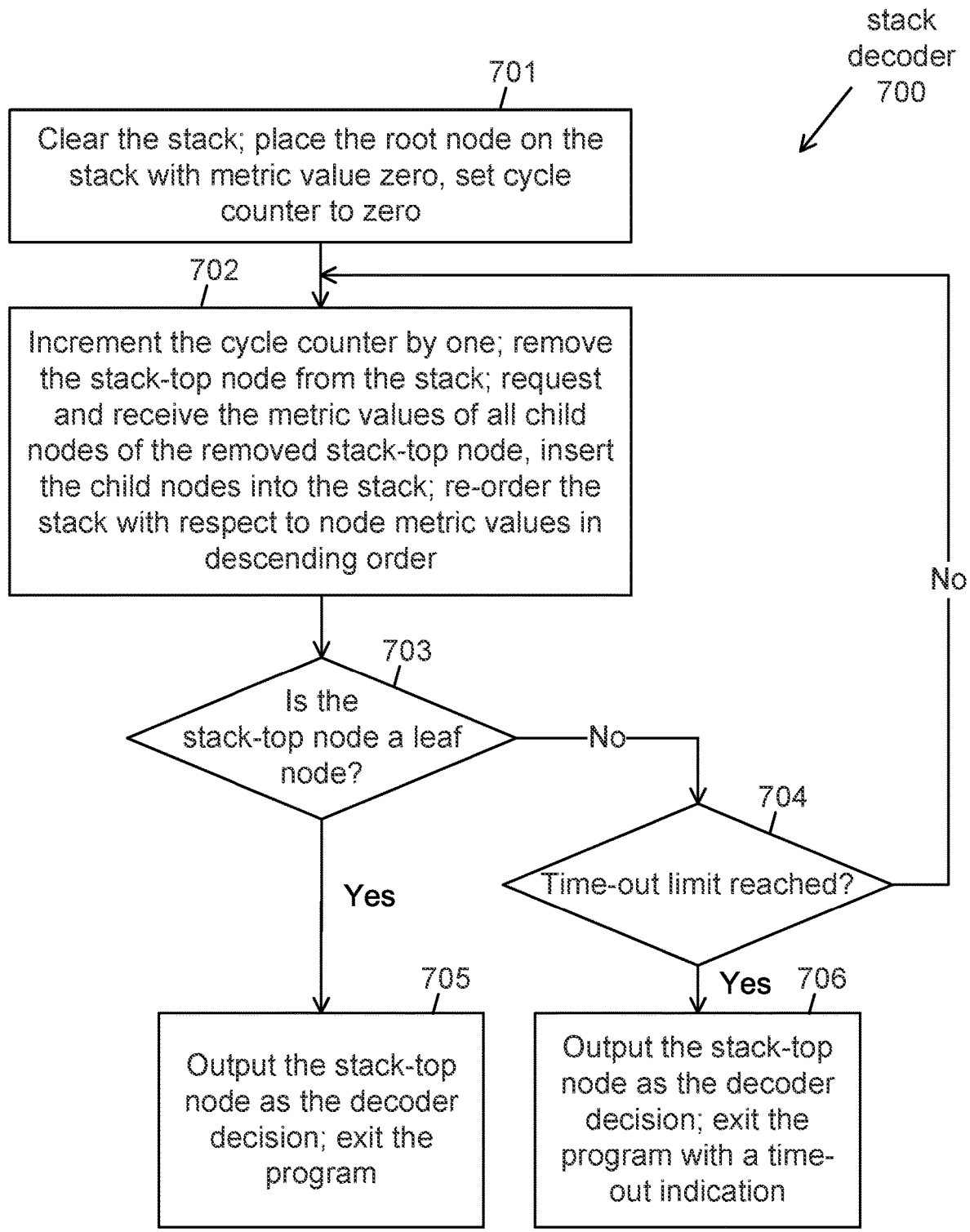
FIG. 7 is a flowchart for a stack decoder for use in a communication system employing error correction coding in accordance with embodiments of the present disclosure.

FIG. 7 is a flowchart of a stack decoder 700, wherein the stack decoder is a decoding algorithm for tree codes and can be run on a general purpose computer with a random access memory and processor unit. The term stack in the flowchart 700 refers to a data structure, generally known as a priority queue. The stack resides in the random access memory and contains a plurality of nodes, wherein each node on the stack is a data record associated with a node in a tree code. The nodes on the stack are ordered in decreasing order of a node metric. The node on the stack with the highest metric value is referred to as the stack-top node. The stack decoder 700 comprises an initialization step 701, a look forward step 702, a termination check step 703, a time-out check step 704, a regular exit step 705, and a time-out step 706. In the initialization step 701, the stack is cleared, a root node of the tree is placed on the stack as the stack-top node with a metric value of zero, a cycle counter is set to zero, and control is passed to the look forward step 702. In the look forward step 702, the cycle counter is incremented by one, the stack-top node is removed from the stack, the metric values of all child nodes of the removed stack-top node are requested and received from a metric computer, the child nodes are inserted into the stack, all nodes on the stack are re-ordered with respect to their metric values in descending order, and control is passed to the termination check step 703. In the termination check step 703, it is checked if the present stack-top node is a leaf node in the tree; if the answer is YES, control is passed to the regular exit step 705; else (if the answer is NO), control is passed to the time-out check step 704. In the regular exit step 705, the stack decoder 700 outputs the stack-top node as the final decoder decision and the algorithm terminates. In the time-out check step 704, a check is made if the cycle counter exceeds a time-out limit; if the answer is YES, control is passed to the time-out exit step 706; else if the answer is NO, control is passed to the look forward step 702. In the time-out exit step 706, the stack decoder outputs the current stack-top node as the final decoder decision with an indication that there was a time-out.

It will be clear to those skilled in the art that the stack decoder 700 described above can be used to implement the preferred embodiment of the TF decoder 230 by assigning the responsibility of maintaining the stack and generating node metric requests to the outer decoder 232 and the responsibility of computing the node metric values to the inner decoder 231. The splitting of the functions of node metric calculation and tree search can be seen as a method of forward (inner decoding) and backward (outer decoding) substitution akin to solving a system of linear equations using triangular factorization methods in linear algebra.

A most preferred embodiment of the TF encoder 210. The most preferred embodiment of the TF encoder 210 is a special case of the preferred embodiment of the TF encoder 210 such that the field $\mathbb{F}_q$ is restricted to be the binary field $\mathbb{F}_2$ (q=2), the data index set $\mathcal{A}$ is constructed using a score function, the outer transform matrix $G_{out}$ is a non-singular strictly upper-triangular Toeplitz matrix defined by an impulse response c, and the inner transform matrix is chosen as $G_{in} = F^{\otimes n}$ where $$F = \begin{bmatrix} 1 & 0 \\ 1 & 1 \end{bmatrix}.$$

It will be clear to the person skilled in the art that the preferred embodiment of the transform encoder can be implemented by combining the exemplary implementations presented in FIGS. 3, 4, 5, and 6.

A most preferred embodiment of the TF decoder 230. In the most preferred embodiment of the TF decoder 230, the constraints on the TF code parameters ($G_{out}$, $G_{in}$, $\mathcal{A}$, a) are the same as in the most preferred embodiment of the TF encoder 210 and need not be specified separately. In the most preferred embodiment of the TF decoder 230, the inner decoder 231 computes the Fano metric and the outer decoder 232 implements the sequential decoding algorithm by adjusting the Fano metric received from the inner decoder 231 as described above. A matching pair of the most preferred embodiment of the TF encoder 210 and the most preferred embodiment of the TF decoder 230 constitute a most preferred embodiment of the TF coding system 200.

Figure 8A:
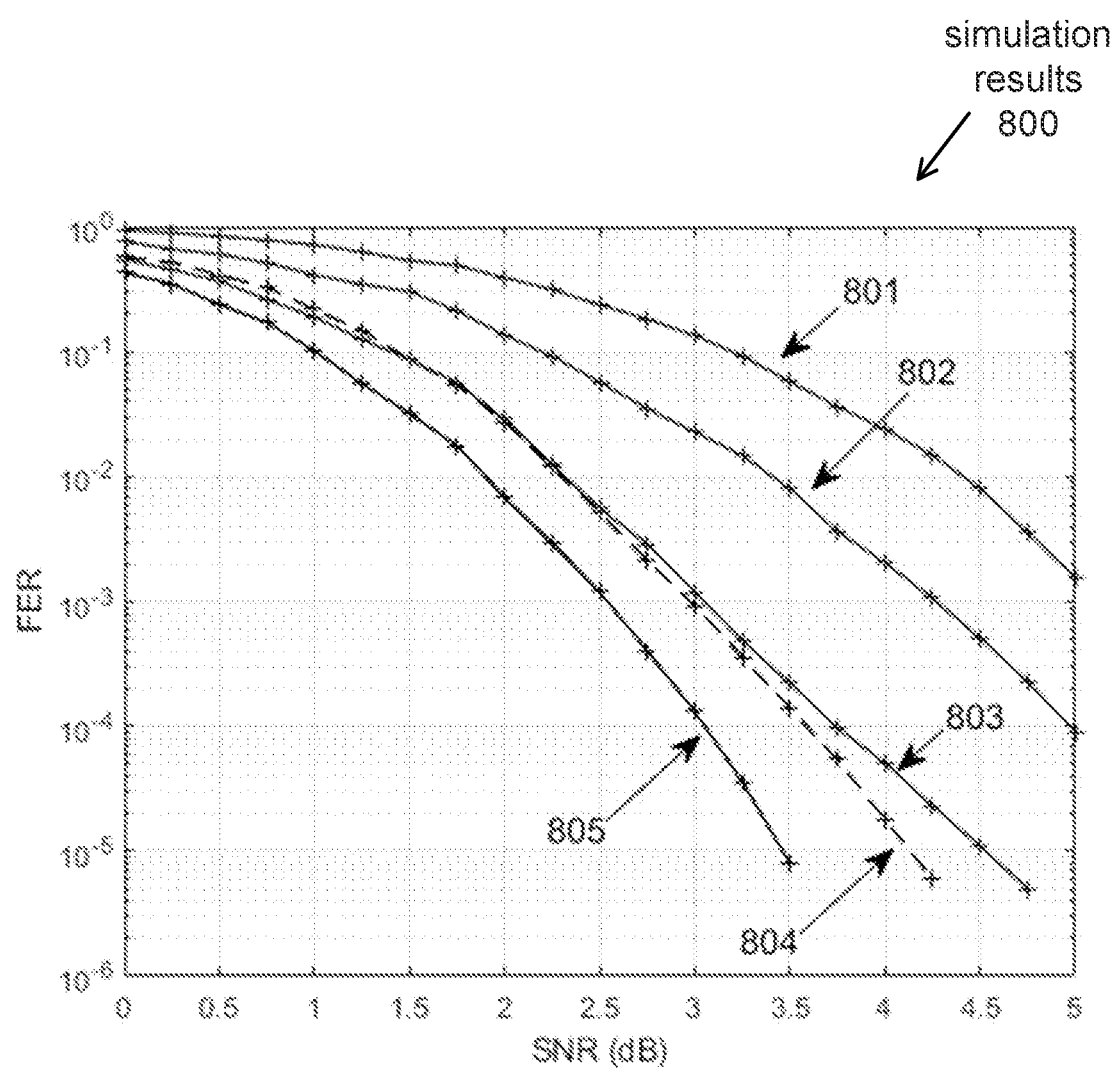
FIG. 8A is a graph showing simulation results that demonstrate a performance advantage of the present principles relative to prior art in polar coding.

Turning to FIG. 8A, we see simulation results 800 for comparing the present principles with the prior art. The simulation results 800 comprise five performance curves 801 through 805. The performance curve 805 belongs to an exemplary TF coding system constructed in accordance with the most preferred embodiment of the present principles (namely, the most preferred embodiment of the TF encoder 210 and the most preferred embodiment of the TF decoder 230). The simulation results show a clear advantage for the present principles. For a fair comparison, all five coding systems in FIG. 8A are codes over the binary field $\mathbb{F}_2$, and have a common code block length N=128, and a common source block length K=64 for an overall coding rate of R=½. The channel used in the simulations is a binary-input memoryless channel with input alphabet X=$\mathbb{F}_2$, output alphabet Y=$\mathbb{R}$ (real numbers), and channel transition probability density function $$W(y|x) = \frac{1}{\sqrt{2\pi\sigma^2}} e^{-\frac{(y-s)^2}{2\sigma^2}}$$

where x∈X, y∈Y, and s=1 if x=0 and s=−1 if x=1. Those skilled in the art will recognize that this channel as a model for binary signaling over an Additive White Gaussian Noise (AWGN) channel. We will refer to this channel as "the AWGN channel" in the rest of this discussion. The AWGN channel is characterized by its signal-to-noise ratio (SNR) which is defined as $1/\sigma^2$. In the simulation study, the SNR parameter is varied from 0 dB to 5 dB in steps of 0.5 dB and the FER values are measured at each SNR point by carrying out trials until the number of trials reaches hundred thousand or the number of frame errors reaches 100 (whichever occurs first). Details of the simulation study are as follows.

The performance curve 805 belongs to a TF coding system constructed in accordance with the most preferred embodiment of the TF coding system so that the outer transform matrix $G_{out}$ is an upper-triangular Toeplitz matrix characterized by the impulse response c=(1,0,1,1,0,1,1), the inner transform is $G_{in}=F^{\otimes 7}$ with $$F = \begin{bmatrix} 1 & 0 \\ 1 & 1 \end{bmatrix},$$

the data index set $\mathcal{A}$ is constructed using the Hamming score function ($\mathcal{A}$ ={16, 24, 28, 30, 31, 32, 40, 44, 46, 47, 48, 52, 54, 55, 56, 58, 59, 60, 61, 62, 63, 64, 72, 76, 78, 79, 80, 84, 86, 87, 88, 90, 91, 92, 93, 94, 95, 96, 100, 102, 103, 104, 106, 107, 108, 109, 110, 111, 112, 114, 115, 116, 117, 118, 119, 120, 121, 122, 123, 124, 125, 126, 127, 128}, which coincides with the Reed-Muller code), the FDB a equals 0, the inner decoder 231 uses the Fano metric, and the outer decoder 232 uses the sequential decoding algorithm. It is instructive to analyze the code rates for this scheme. As stated before, the present principles aim to operate at rates $R_{out}$=R and $R_{in}$=1 for a given overall code rate R. Here, we have R=½. The outer and inner code rates are $R_{out}$=64/112 and $R_{in}$=112/128. We have $R_{out}$=64/112 because the smallest element of the data index set $\mathcal{A}$ is equal to 16, so the first 16 frozen bits of the DCB v propagate through the causal transform u=v$G_{out}$ and the first 16 bits of the OTB u remain frozen. Hence, effectively, the outer code has a code block length 128−16=112 instead of 128. This example shows that although the present principles aim for the rates $R_{out}$=R and $R_{in}$=1, this objective may not be fulfilled perfectly due to the artefact that the first element of the data index set may not be 1.

The performance curve 801 belongs to a Reed-Muller code with successive cancellation (SC) decoding. The Reed-Muller code here is obtained as a special instance of transform coding (with $G_{out}$=I (the identity matrix), $G_{in}=F^{\otimes 7}$, $\mathcal{A}$ chosen using the Hamming score function, and a=0). So, the comparison of 801 with 805 shows the benefits of using an outer transform in accordance with the present principles. As a (degenerate) concatenated coding system, the Reed-Muller code here has rates $R_{out}$=1, $R_{in}$=½, and R=½.

The performance curve 802 belongs to a polar code with successive cancellation decoding. This case may also be seen as a degenerate form of transform coding (with $G_{out}$=I, $G_{in}=F^{\otimes 7}$, $\mathcal{A}$ chosen using the mutual-information score function (optimized at 3 dB SNR), and a=0). The comparison of 802 with 805 shows the benefits of using an outer transform in accordance with the present principles. As a (degenerate) concatenated coding system, the polar code here has rates $R_{out}$=1, $R_{in}$=½, and R=½.

The performance curve 803 belongs to a concatenated coding system (in the sense of Forney) for which the outer code is a 4-bit cyclic-redundancy-check (CRC) code, the inner code is a Reed-Muller code, and the decoder is a CRC-aided successive-cancellation-list (CA-SCL) decoder with list size 32 and CRC length 4 bits. (The 4-bit CRC yields the best performance among alternative lengths of 0, 4, 8, 16 bits.) The code rates are $R_{out}$=64/68, $R_{in}$=68/128, and R=½.

The performance curve 804 belongs to a concatenated coding system for which the outer code is an 8-bit CRC code, the inner code is a polar code optimized for 3 dB SNR, and the decoder is a CA-SCL decoder with list size 32 and CRC length 8 bits. (The 8-bit CRC yields the best performance among alternative lengths of 0, 4, 8, 16 bits.) The code rates are $R_{out}$=64/72, $R_{in}$=72/128, and R=½.

To summarize, FIG. 8A shows that the exemplary TF coding system provides significantly better performance than the prior art in Reed-Muller and polar codes even when the latter are decoded using a fairly complex CA-SCL decoder. It is worth noting that this significant improvement is obtained at a relatively small block length of N=128. Codes at such short block lengths are usually employed to protect sensitive control information in communication systems, such as telemetry information in space communications and resource allocation information in cellular systems. Thus, FIG. 8A demonstrates the practical utility and potential applications of the present principles. It is also worth noting that the rate pair ($R_{out}$, $R_{in}$) for the present principles is substantially different than those for the other codes that represent the prior art. The present principles set the rate $R_{out}$ near ½ and $R_{in}$ near 1 while the prior art techniques set $R_{out}$ near or equal to 1 and $R_{in}$ near or equal to ½. While the present principles rely mainly on a strong outer code for error correction, the prior art methods rely mainly on the strength of the inner code for error correction.

Figure 8B:
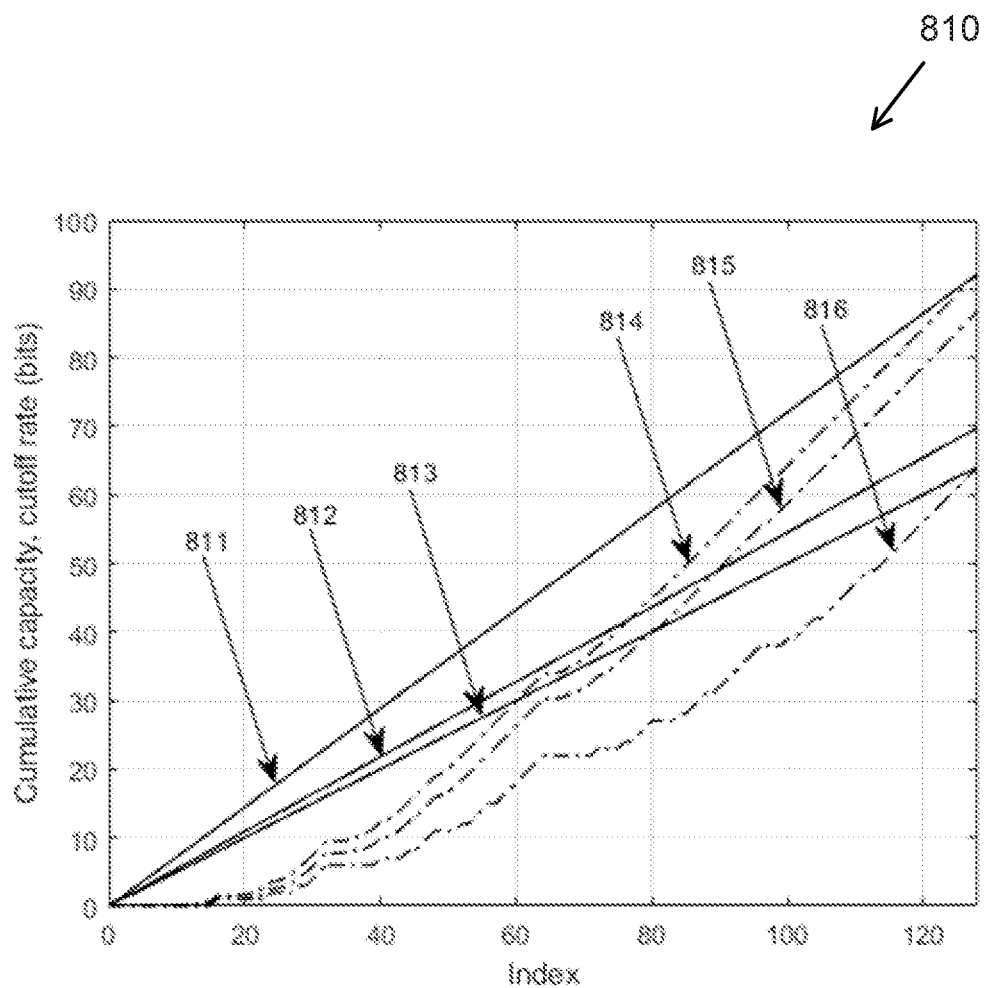
FIG. 8B is a graph comparing information and rate allocation profiles for the present principles and the prior art.

Next, we turn to FIG. 8B to discuss the design of the TF coding system whose performance is shown by the curve 805. FIG. 8B shows a graph 810 that compares information and rate allocation profiles for the present principles and the prior art. All curves in FIG. 8B are computed for the AWGN channel at 3 dB SNR. The capacity and the cutoff rate of the AWGN channel at 3 dB SNR are given by I(W)=0.72 bits and $R_o$(W)=0.55 bits, respectively.

The prior art is represented in FIG. 8B by the curves 811, 812, and 813, which are, respectively, the cumulative capacity i·I(W), the cumulative cutoff rate i·$R_0$(W), and the cumulative rate i·R versus the index variable i. The numerical values for the curves 811, 812, and 813 represent a convolutional code of rate R=½. (Actually, a more precise plot of the cumulative rate for a convolutional code of rate 1/2 would have a jump of 1 bit at odd time indices. So, the curve 813 is an approximation.) We see that the rate profile 813 for the convolutional code of rate 1/2 lies below the cutoff rate profile 812; so, we anticipate that a sequential decoder can be used to decode the convolutional code without excessive computational complexity. On the other hand, the gap between the cutoff rate profile 812 and the rate profile 813 is quite narrow; so, we also anticipate that occasionally there will be long searches that will result in decoder time-outs and/or buffer overflows.

The present principles are represented in FIG. 8B by the curves 814, 815, and 816, which are, respectively, the cumulative capacity $I(V^i; Y)=\Sigma_{j=1}^{i} I(V_j; Y|V^{j-1})$, the cumulative cutoff rate $\Sigma_{j=1}^{i} R_0(V_j; Y|V^{j-1})$, and the cumulative rate $\Sigma_{j=1}^{i} \chi_{\mathcal{A}}(j)$ as a function of the index variable i∈{1, 2, ..., N}. The numerical values for the curves 814, 815, 816 belong to the TF code whose performance was discussed above in connection with the curve 805. The curves 814 and 815 exhibit, respectively, a polarization effect (as seen at the outer decoder 232) for the channel capacity and cutoff rate. For small values of the index i, the cumulative capacity 814 and the cumulative cutoff rate 815 rise very slowly, indicating a polarization of the respective quantities to 0; for large values of the index i, the slope of the curves 814 and 815 approach 1, indicating a polarization of the respective quantities to 1. It is noteworthy that the TF coding system boosts the cutoff rate in the sense that the final value of the curve 815 is significantly larger than the final value of the curve 812. The TF code boosts the cutoff rate thanks to the effect of the inner transform $G_{in}$ and a sequential decoder situated inside the outer decoder 232 can take advantage of the increased cutoff rate. We observe that the rate curve 816 has a widening gap with the cutoff rate curve 815, which translates to reduced complexity (in terms of the mean and higher order moments of the computation) in sequential decoding.

FIG. 9 illustrates an example wireless network within which error correction coding may be implemented according to this disclosure. The embodiment of the wireless network 900 shown in FIG. 9 is for illustration only. Other embodiments of the wireless network 900 could be used without departing from the scope of this disclosure. The wireless network 900 includes an eNodeB (eNB) 901, an eNB 902, and an eNB 903. The eNB 901 communicates with the eNB 902 and the eNB 903. The eNB 901 also communicates with at least one Internet Protocol (IP) network 930, such as the Internet, a proprietary IP network, or other data network.

Depending on the network type, other well-known terms may be used instead of "eNodeB" or "eNB," such as "base station," "BS," or "access point." For the sake of convenience, the terms "eNodeB" and "eNB" are used in this patent document to refer to network infrastructure components that provide wireless access to remote terminals. Also, depending on the network type, other well-known terms may be used instead of "user equipment" or "UE," such as "mobile station" (or "MS"), "subscriber station" (or "SS"), "remote terminal," "wireless terminal," or "user device." For the sake of convenience, the terms "user equipment" and "UE" are used in this patent document to refer to remote wireless equipment that wirelessly accesses an eNB, whether the UE is a mobile device (such as a mobile telephone or smartphone) or is normally considered a stationary device (such as a desktop computer or vending machine).

The eNB 902 provides wireless broadband access to the network 930 for a first plurality of user equipments (UEs) within a coverage area 920 of the eNB 902. The first plurality of UEs includes a UE 911, which may be located in a small business (SB); a UE 912, which may be located in an enterprise (E); a UE 913, which may be located in a WiFi hotspot (HS); a UE 914, which may be located in a first residence (R1); a UE 915, which may be located in a second residence (R2); and a UE 916, which may be a mobile device (M) like a cell phone, a wireless laptop, a wireless personal digital assistant (PDA), tablet, or the like. The eNB 903 provides wireless broadband access to the network 930 for a second plurality of UEs within a coverage area 925 of the eNB 903. The second plurality of UEs includes the UE 915 and the UE 916. In some embodiments, one or more of the eNBs 901-903 may communicate with each other and with the UEs 911-916 using 3G, 4G or 5G, long-term evolution (LTE), LTE-A, WiMAX, or other advanced wireless communication techniques.

Dotted lines show the approximate extents of the coverage areas 920 and 925, which are shown as approximately circular for the purposes of illustration and explanation only. It should be clearly understood that the coverage areas associated with eNBs, such as the coverage areas 920 and 925, may have other shapes, including irregular shapes, depending upon the configuration of the eNBs and variations in the radio environment associated with natural and man-made obstructions.

As described in more detail below, one or more of BS 901, BS 902 and BS 903 include 2D antenna arrays as described in embodiments of the present disclosure. In some embodiments, one or more of BS 901, BS 902 and BS 903 support the codebook design and structure for systems having 2D antenna arrays.

Although FIG. 9 illustrates one example of a wireless network 900, various changes may be made to FIG. 9. For example, the wireless network 900 could include any number of eNBs and any number of UEs in any suitable arrangement. Also, the eNB 901 could communicate directly with any number of UEs and provide those UEs with wireless broadband access to the network 930. Similarly, each eNB 902-903 could communicate directly with the network 930 and provide UEs with direct wireless broadband access to the network 930. Further, the eNB 901, 902, and/or 903 could provide access to other or additional external networks, such as external telephone networks or other types of data networks.

The example channel decoding systems depicted in the figures and described above may be implemented in an eNB (such as eNB 902) and/or a UE (such as UE 916), as described in further detail below.

Figure 10A:
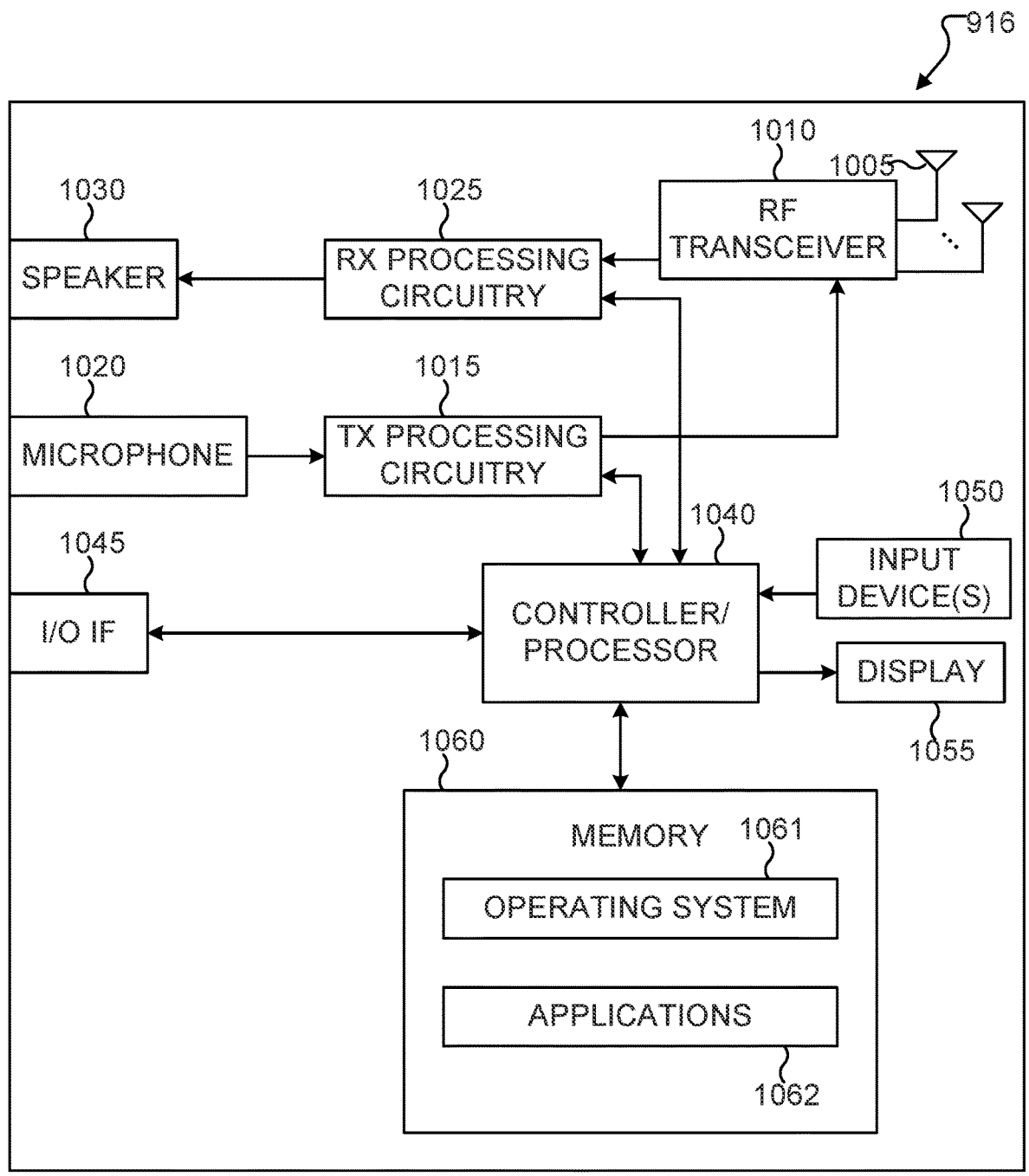
FIG. 10A illustrates an example user equipment network within which error correction coding may be implemented according to this disclosure.

FIG. 10A illustrates an example user equipment network within which error correction coding may be implemented according to this disclosure. The embodiment of the UE 916 illustrated in FIG. 10A is for illustration only, and the UEs 911-915 of FIG. 9 could have the same or similar configuration. However, UEs come in a wide variety of configurations, and FIG. 10A does not limit the scope of this disclosure to any particular implementation of a UE.

The UE 916 includes an antenna 1005, a radio frequency (RF) transceiver 1010, transmit (TX) processing circuitry 1015 (which may include the encoder 110 in FIG. 1), a microphone 1020, and receive (RX) processing circuitry 1025 (which may include the decoder 130 in FIG. 1). The UE 916 also includes a speaker 1030, a main processor 1040, an input/output (I/O) interface (IF) 1045, a keypad 1050, a display 1055, and a memory 1060. The memory 1060 includes a basic operating system (OS) program 1061 and one or more applications 1062. Either the OS program 1061, one of the applications 1062, or some combination thereof may implement programming for employing error correction coding as described in the various embodiments of FIGS. 1 through 8.

The RF transceiver 1010 receives, from the antenna 1005, an incoming RF signal transmitted by an eNB of the network 900. The RF transceiver 1010 may down-convert the incoming RF signal to generate an intermediate frequency (IF) or baseband signal which would be sent to the receiver (Rx) processing circuitry 1025. The Rx processing circuitry 1025 transmits the processed signal to the speaker 1030 (such as for voice data) or to the main processor 1040 for further processing (such as for web browsing data).

The transmit (Tx) processing circuitry 1015 receives, as at least some input data for the source data block, analog or digital voice data from the microphone 1020 or other outgoing baseband data (such as web data, e-mail, or interactive video game data) from the main processor 1040. The Tx processing circuitry 1015 implements encoding. The RF transceiver 1010 receives the outgoing processed baseband or IF signal from the Tx processing circuitry 1015 and up-converts the baseband or IF signal to an RF signal that is transmitted via the antenna 1005.

The main processor 1040 can include one or more processors or other processing devices and execute the basic OS program 1061 stored in the memory 1060 in order to control the overall operation of the UE 916. For example, the main processor 1040 could control the reception of forward channel signals and the transmission of reverse channel signals by the RF transceiver 1010, the Rx processing circuitry 1025, and the Tx processing circuitry 1015 in accordance with well-known principles. In some embodiments, the main processor 1040 includes at least one programmable microprocessor or microcontroller, while in other embodiments the main processor includes dedicated circuitry (e.g., for systemic and/or non-systematic encoding or decoding processes, puncturing processes, data mapping, etc.) as well as (optionally) programmable logic or processing circuits.

The main processor 1040 is also capable of executing other processes and programs resident in the memory 1060, such as operations for channel quality measurement and reporting for systems having 2D antenna arrays. The main processor 1040 can move data and/or instructions into or out of the memory 1060 as required by an executing process. In some embodiments, the main processor 1040 is configured to execute the applications 1062 based on the OS program 1061 or in response to signals received from eNBs or an operator. The main processor 1040 is also coupled to the I/O interface 1045, which provides the UE 916 with the ability to connect to other devices such as laptop computers and handheld computers. The I/O interface 1045 is the communication path between these accessories and the main controller 1040.

The main processor 1040 is also coupled to the keypad 1050 (which may simply be a single button or may be an array or other set of buttons) and the display unit 1055. The operator of the UE 916 can use the keypad 1050 to enter data into the UE 916. The display 1055 may be a touch screen display or other display capable of rendering text and/or at least limited graphics, such as from web sites, and receiving touch inputs by a user in accordance with known practices. The memory 1060 is coupled to the main processor 1040, and at least a part of the memory 1060 could include a random access memory (RAM), and another part of the memory 1060 could include a Flash memory or other read-only memory (ROM).

Although FIG. 10A illustrates one example of UE 916, various changes may be made to FIG. 10A. For example, various components in FIG. 10A could be combined, further subdivided, or omitted and additional components could be added according to particular needs. As a particular example, the main processor 1040 could be divided into multiple processors, such as one or more central processing units (CPUs) and one or more graphics processing units (GPUs). Also, while FIG. 10A illustrates the UE 916 configured as a mobile telephone or smartphone, UEs could be configured to operate as other types of mobile or stationary devices.

Figure 10B:
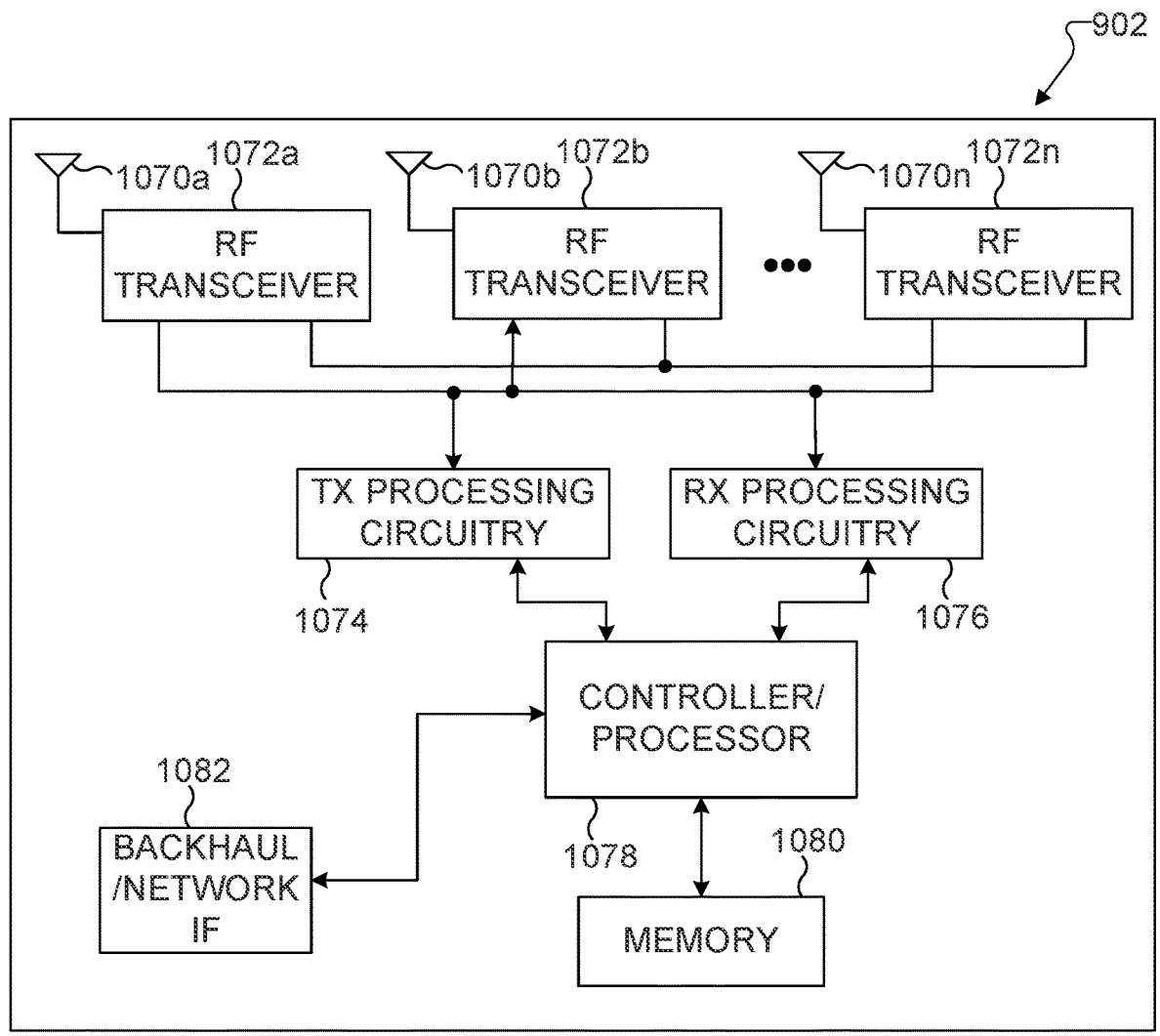
FIG. 10B illustrates an example enhanced NodeB (eNB) network within which error correction coding may be implemented according to this disclosure.

FIG. 10B illustrates an example enhanced NodeB (eNB) network within which error correction coding may be implemented according to this disclosure. The embodiment of the eNB 902 shown in FIG. 10B is for illustration only, and other eNBs of FIG. 9 could have the same or similar configuration. However, eNBs come in a wide variety of configurations, and FIG. 10B does not limit the scope of this disclosure to any particular implementation of an eNB. It is noted that eNB 901 and eNB 903 can include the same or similar structure as eNB 902.

As shown in FIG. 10B, the eNB 902 includes multiple antennas 1070a-1070n, multiple RF transceivers 1072a-1072n, transmit (Tx) processing circuitry 1074, and receive (Rx) processing circuitry 1076. In certain embodiments, one or more of the multiple antennas 1070a-1070n include 2D antenna arrays. The eNB 902 also includes a controller/processor 1078, a memory 1080, and a backhaul or network interface 1082.

The RF transceivers 1072a-1072n receive, from the antennas 1070a-1070n, incoming RF signals, such as signals transmitted by UEs or other eNBs. The RF transceivers 1072a-1072n down-convert the incoming RF signals to generate IF or baseband signals. The IF or baseband signals are sent to the Rx processing circuitry 1076, which generates processed signals by filtering, decoding, and/or digitizing the baseband or IF signals. The Rx processing circuitry 1076 transmits the processed signals to the controller/processor 1078 for further processing.

The Tx processing circuitry 1074 receives, as at least some input data for source data blocks, analog or digital data (such as voice data, web data, e-mail, or interactive video game data) from the controller/processor 1078. The Tx processing circuitry 1074 implements circuits to encode, multiplex, and/or digitize the outgoing baseband data to generate processed signals. The RF transceivers 1072a-1072n receive the outgoing processed signals from the Tx processing circuitry 1074 and up-converts the baseband or IF signals to RF signals that are transmitted via the antennas 1070a-1070n.

The controller/processor 1078 can include one or more processors or other processing devices that control the overall operation of the eNB 902. For example, the controller/processor 1078 could control the reception of forward channel signals and the transmission of reverse channel signals by the RF transceivers 1072a-1072n, the Rx processing circuitry 1076, and the Tx processing circuitry 1074 in accordance with well-known principles. The controller/processor 1078 could support additional functions as well, such as more advanced wireless communication functions. Any of a wide variety of other functions could be supported in the eNB 902 by the controller/processor 1078. In some embodiments, the controller/processor 1078 includes at least one microprocessor or microcontroller, while in other embodiments the main processor includes dedicated circuitry (e.g., for systemic and/or non-systematic encoding processes, puncturing processes, data mapping, etc.) as well as (optionally) programmable logic or processing circuits.

The controller/processor 1078 is also capable of executing programs and other processes resident in the memory 1080, such as a basic OS. The controller/processor 1078 is also capable of supporting channel quality measurement and reporting for systems having 2D antenna arrays. In some embodiments, the controller/processor 1078 supports communications between entities. The controller/processor 1078 can move data and/or instructions into or out of the memory 1080 as required by an executing process.

The controller/processor 1078 is also coupled to the backhaul or network interface 1082. The backhaul or network interface 1082 allows the eNB 902 to communicate with other devices or systems over a backhaul connection or over a network. The interface 1082 could support communications over any suitable wired or wireless connection(s). For example, when the eNB 902 is implemented as part of a cellular communication system (such as one supporting 3G, 4G, 5G, LTE, or LTE-A), the interface 1082 could allow the eNB 902 to communicate with other eNBs over a wired or wireless backhaul connection. When the eNB 902 is implemented as an access point, the interface 1082 could allow the eNB 902 to communicate over a wired or wireless local area network or over a wired or wireless connection to a larger network (such as the Internet). The interface 1082 includes any suitable structure supporting communications over a wired or wireless connection, such as an Ethernet or RF transceiver.

The memory 1080 is coupled to the controller/processor 1078. Part of the memory 1080 could include a RAM, and another part of the memory 1080 could include a Flash memory or other ROM. In certain embodiments, a plurality of instructions is stored in memory. The instructions are configured to cause the controller/processor 1078 to perform the systemic and/or non-systematic encoding or decoding processes, puncturing processes, data mapping, etc.

Although FIG. 10B illustrates one example of an eNB 902, various changes may be made to FIG. 10B. For example, the eNB 902 could include any number of each component shown. As a particular example, an access point could include a number of interfaces 1082, and the controller/processor 1078 could support routing functions to route data between different network addresses. As another particular example, while shown as including a single instance of Tx processing circuitry 1074 and a single instance of Rx processing circuitry 1076, the eNB 902 could include multiple instances of each (such as one per RF transceiver).

Comparison with the prior art. In this part of the present disclosure, we compare the present principles with the prior art and point out some key differences.

From a practical standpoint, the most important aspect of the present principles is that they provide a significant performance gain over the prior art, as shown by FIG. 8A. This improvement is obtained by combining several techniques. An inner transform is used as a means of creating channel polarization. An outer transform is used to create a tree code. A data index set selection method (based on a novel score function method) is used to regulate the intake of source data bits in accordance with the amount of polarized information available to a depth-first tree search algorithm at the decoder. The present principles use triangular factorization as an efficient and powerful method of solving a set of linear equations when the equations are corrupted by noise.

The prior art in polar coding achieves the best known performance results by various concatenation schemes, notably by using a CRC as an outer code and a list-decoder for decoding the inner polar code. In such CRC-aided list-decoding methods, the outer code has a rate $R_{out}$ close to 1 and the inner code has a rate $R_{in}$ slightly above the target rate R for the overall code, subject to the constraint that $R=R_{out}R_{in}$; the complexity resides almost fully inside the inner decoder, while the outer decoder carries out a simple CRC check. The present principles differ from concatenation schemes in the prior art in certain important respects. First of all, the present principles in their preferred embodiments employ an inner code with rate $R_{in}$ close to 1 and an outer code with rate $R_{out}$ close to R. In other words, the inner code adds no significant redundancy (hence has no significant error-correction capability as a stand-alone code). The present principles rely mainly on a strong outer code for error correction, the prior art concatenation method rely mainly on the strength of an inner code for error correction.

Polar transform is used in the prior art as a stand-alone coding scheme with some coordinates of the polar transform input frozen; the present principles employ polar transforms as a means of creating channel polarization. The present principles in their preferred embodiments take advantage of the polarized mutual information provided by the inner decoder to construct a tree code that can be decoded using a tree search algorithm.

For low-complexity, the tree code is constructed using a convolution operation. Unlike convolutional codes in the prior art, the input to the convolutional operation is a mixture of data symbols and frozen symbols. The mixing of the data symbols and frozen symbols is done in accordance with an algorithm that matches the offered data rate to the polarized information coming from the channel by way of the inner transform. In their preferred embodiments, the TF codes enjoy the benefits of both a strong decoder (sequential decoder) for decoding an outer code and the beneficial effects of polarization for boosting the cutoff rate of sequential decoding provided by the inner transform.

Convolutional coding in the prior art uses a time-invariant rate profile, which is suitable for a memoryless channel. The present principles employ a type of convolutional coding when a subset of coordinates of the input to the outer transform are frozen; however, the resulting convolutional code has a time-varying rate profile which is matched to the time-varying information profile of the effective channel seen by the outer transform. Convolutional codes in the prior art require a termination; the outer transform in accordance with the present principles does not use a termination.

Sequential decoders in the prior art are mainly used with memoryless channels; the present principles employ sequential decoding to decode a code over a channel with memory (the channel created by the inner polar transform has memory). Sequential decoders in the prior art use time-invariant bias terms that do not depend on the depth of the nodes; the sequential decoders in accordance with the present principles use time-varying bias terms that depend on the depth of the node in the code tree.

Extensions of the present principles. Here we point out some directions in which the present principles can be extended readily. All such extensions will be clear to the person skilled in the art and they are covered by the present disclosure.

As pointed out above, the present principles can be applied with any tree-search algorithm as part of the outer decoder 232. One possibility is to use Viterbi decoding which is an ML procedure for decoding convolutional codes over memoryless channels. Viterbi decoding is sub-optimal for decoding TF codes since the outer coder 232 sees a channel with memory due to the presence of an inner decoder 231 between the channel 120 and the outer decoder 232. However, it is still possible to use a Viterbi decoder with or without a list to decode TF codes.

For simplicity of exposition, we have defined TF codes so that the outer transform $G_{out}$ is a strictly upper-triangular matrix and the inner transform $G_{in}$ is a strictly lower-triangular matrix. It will be clear to the skilled person in the art that the benefits the present principles can be preserved even if one uses an outer transform of the form $G_{out}=PUQ$ or an inner transform of the form $G_{in}=P'LQ'$ where P, Q, P', Q' are permutation matrices, and U and L are, respectively, strictly upper-triangular and strictly lower-triangular matrices. The present principles foresee that the introduction of such permutations may facilitate the implementation of the present principles in hardware or software. All such variations of the methods in the present disclosure are covered by the present principles.

The outer transform matrix $G_{out}$ and the inner transform matrix $G_{in}$ are non-singular matrices in the preferred embodiments of the present principles. However, we foresee that in some embodiments of the present principles either $G_{out}$ or $G_{in}$ may be singular or even non-square. This situation may arise, for example, if some elements of the TCB are punctured, which is equivalent to dropping some columns of $G_{in}$.

It will be clear to the person skilled in the art that the essential ideas behind the present principles may be applied even when the outer transform $G_{out}$ and the inner transform $G_{in}$ do not have the same dimensions. For example, if the number of rows of $G_{in}$ is larger than the number of columns of $G_{out}$, one may be able to insert a second source data block or a second frozen data block into the input of the inner transform $G_{in}$.

While particular embodiments of METHODS AND APPARATUS FOR ERROR CORRECTION CODING WITH TRIANGULAR FACTORIZATION OF GENERATOR MATRIX are herein described in detail and depicted in the drawings, it is to be understood that the subject matter which is encompassed by the present disclosure is limited only by the claims. Although the present disclosure has been described with exemplary embodiments, various changes and modifications may be suggested to one skilled in the art. It is intended that the present disclosure encompass such changes and modifications that fall within the scope of the appended claims. The description in the present application should not be read as implying that any particular element, step, or function is an essential or critical element which must be included in the claim scope: the scope of patented subject matter is defined only by the allowed claims. Moreover, none of these claims are intended to invoke 35 USC § 112(f) with respect to any of the appended claims or claim elements unless the exact words "means for" or "step for" are explicitly used in the particular claim, followed by a participle phrase identifying a function. Use of terms such as (but not limited to) "mechanism," "module," "device," "unit," "component," "element," "member," "apparatus," "machine," "system," "processor," or "controller" within a claim is understood and intended to refer to structures known to those skilled in the relevant art, as further modified or enhanced by the features of the claims themselves, and is not intended to invoke 35 U.S.C. § 112(f).

What is claimed is:

1. An encoder apparatus for use in a communication system for encoding of a source data block d into a transmitted code block x, the encoder apparatus comprising:
 a data inserter; and
 a transform encoder,
 wherein the encoder apparatus is configured according to a set of parameters (N, K, $G_{out}$, $G_{in}$, $\mathcal{A}$, a), wherein N is a length of the transmitted code block x, K is a length of the source data block d, wherein $G_{out}$ is an outer transform matrix and $G_{in}$ is an inner transform matrix, wherein $\mathcal{A}$ is a data index set, wherein a is a frozen data block, wherein N and K are integers that satisfy $1 \leq K < N$, wherein the data index set $\mathcal{A}$ is a subset of $\{1, 2, \ldots, N\}$ with a size $|\mathcal{A}|=K$, wherein the frozen data block a has a length N−K, wherein the outer transform matrix $G_{out}$ is an N×N upper-triangular Toeplitz matrix defined by a causal impulse response $c=(c_0, c_1, \ldots, c_{N-1})$, wherein $c_0 \neq 0$ and $c_m \neq 0$ for at least one integer m satisfying $1 \leq m \leq N-1$, wherein the inner transform matrix $G_{in}$ is an N×N lower-triangular polar transform matrix given by a Kronecker power $$G_{in} = \begin{bmatrix} 1 & 0 \\ 1 & 1 \end{bmatrix}^{\otimes n},$$

wherein $n=\log_2 N$, wherein the outer transform matrix $G_{out}$ is further constrained so that $G_{out}G_{in}$ cannot be obtained from $G_{in}$ by any row or column permutation,
 wherein the data inserter is configured to receive the source data block d and generate a data container block v by setting $v_{\mathcal{A}}=d$ and $v_{\mathcal{A}^c}=a$, wherein $v_{\mathcal{A}}$ denotes the part of v corresponding to the coordinates of v whose indices are in $\mathcal{A}$, and wherein $v_{\mathcal{A}^c}$ denotes the part of v corresponding to the coordinates of v whose indices are not in $\mathcal{A}$,
 wherein the transform encoder is configured to receive the data container block v and generate the transmitted code block x by computing $x=vG_{out}G_{in}$,
 wherein the encoder apparatus is further configured to transmit the transmitted code block x to a decoder apparatus via a channel in the communication system.

2. The encoder apparatus of claim 1, wherein the transform encoder comprises:
 an outer transform encoder configured to receive the data container block v and generate an outer transform block u by computing $u=vG_{out}$, and
 an inner transform encoder configured to receive the outer transform block u and generate the transmitted code block x by computing $x=uG_{in}$.

3. The encoder apparatus of claim 1, wherein the encoder apparatus is further configured to determine the data index set $\mathcal{A}$ by means of a score function, wherein the score function depends on the product $G_{out}G_{in}$ of the inner and outer transform matrices $G_{in}$ and $G_{out}$.

4. A decoder apparatus for use in a communication system for a received code block y to generate a decoded source data block d as an estimate of a source data block d, wherein the received code block y comprises a noisy version of a transmitted code block x, the decoder apparatus comprising:
 an inner decoder; and
 an outer decoder,
 wherein the decoder apparatus is configured to receive the received code block y from an encoder apparatus via a channel in the communication system, the decoder apparatus configured according a set of parameters (N, K, $G_{out}$, $G_{in}$, $\mathcal{A}$, a), wherein N is a length of the transmitted code block x, K is a length of the source data block d, wherein $G_{out}$ is an outer transform matrix and $G_{in}$ is an inner transform matrix, wherein $\mathcal{A}$ is a data index set, wherein a is frozen data block, wherein N and K are integers that satisfy $1 \leq K < N$, wherein the data index set A is a subset of $\{1, 2, \ldots, N\}$ with a size $|\mathcal{A}|=K$, wherein the frozen data block a has a length N−K, wherein the outer transform matrix $G_{out}$ is an N×N upper-triangular Toeplitz matrix defined by a causal impulse response $c=(c_0, c_1, \ldots, c_{N-1})$, wherein $c_0 \neq 0$ and $c_m \neq 0$ for at least one integer m satisfying $1 \leq m \leq N-1$, wherein the inner transform matrix $G_{in}$ is an N×N lower-triangular polar transform matrix given by a Kronecker power $$G_{in} = \begin{bmatrix} 1 & 0 \\ 1 & 1 \end{bmatrix}^{\otimes n},$$

wherein $n=\log_2 N$,
 wherein the transmitted code block x is related to the source data block d by a relation $x=vG_{out}G_{in}$, wherein v is a data container block such that $v_{\mathcal{A}}=d$ and $v_{\mathcal{A}^c}=a$, wherein $v_{\mathcal{A}}$ denotes the part of v corresponding to the coordinates of v whose indices are in $\mathcal{A}$, and wherein $v_{\mathcal{A}^c}$ denotes the part of v corresponding to the coordinates of v whose indices are not in $\mathcal{A}$,
 wherein the inner decoder is configured to receive the received code block y, receive node metric requests from the outer decoder, calculate node metrics in accordance with the inner transform matrix $G_{in}$, and send calculated node metrics to the outer decoder, wherein the outer decoder is configured to send node metric requests to the inner decoder, receive calculated node metrics from the inner decoder, and calculate a decoded data container block P in accordance with the outer transform matrix $G_{out}$, the data index set $\mathcal{A}$, and the frozen data block a, and wherein the decoder apparatus is further configured to extract the decoded source data block $\hat{d}$ from the decoded data container block $\hat{v}$ by setting $\hat{d}=\hat{v}_\mathcal{A}$, wherein $\hat{v}_\mathcal{A}$ denotes the part of $\hat{v}$ corresponding to the coordinates of $\hat{v}$ whose indices are in $\mathcal{A}$, and send the decoded source data block $\hat{d}$ to a destination in the communication system.

5. The decoder apparatus of claim 4, wherein the inner decoder calculates the node metrics in accordance with a successive cancellation decoder for polar codes.

6. The decoder apparatus of claim 4, wherein the outer decoder calculates the decoded data container block P by using a tree search algorithm.

7. An encoding method for use in a communication system for encoding of a source data block d into a transmitted code block x using an encoder apparatus including a data inserter and a transform encoder, the method comprising:

configuring the encoder apparatus according to a set of parameters (N, K, $G_{out}$, $G_{in}$, $\mathcal{A}$, a), wherein N is a length of the transmitted code block x, K is a length of the source data block d, wherein $G_{out}$ is an outer transform matrix and $G_{in}$ is an inner transform matrix, wherein $\mathcal{A}$ is a data index set, wherein a is a frozen data block, wherein N and K are integers that satisfy $1 \leq K < N$, wherein the data index set $\mathcal{A}$ is a subset of $\{1, 2, \ldots, N\}$ with a size $|\mathcal{A}|=K$, wherein the frozen data block a has a length $N-K$, wherein the outer transform matrix $G_{out}$ is an $N \times N$ upper-triangular Toeplitz matrix defined by a causal impulse response $c=(c_0, c_1, \ldots, c_{N-1})$, wherein $c_0 \neq 0$ and $c_m \neq 0$ for at least one integer m satisfying $1 \leq m \leq N-1$, wherein the inner transform matrix $G_{in}$ is an $N \times N$ lower-triangular polar transform matrix given by a Kronecker power $$G_{in} = \begin{bmatrix} 1 & 0 \\ 1 & 1 \end{bmatrix}^{\otimes n},$$

wherein $n=\log_2 N$, wherein the outer transform matrix $G_{out}$ is further constrained so that $G_{out}G_{in}$ cannot be obtained from $G_{in}$ by any row or column permutation, the encoding method comprising:

receiving, at the data inserter, the source data block d;

generating, within the data inserter, a data container block v by setting $v_\mathcal{A}=d$ and $v_{\mathcal{A}^c}=a$, wherein $v_\mathcal{A}$ denotes the part of v corresponding to the coordinates of v whose indices are in $\mathcal{A}$, and wherein $V_{\mathcal{A}^c}$ denotes the part of v corresponding to the coordinates of v whose indices are not in $\mathcal{A}$;

receiving the data container block v at the transform encoder from the data inserter;

generating, in the transform encoder, the transmitted code block x by computing $x=vG_{out}G_{in}$; and transmitting the transmitted code block x to a decoder via a channel in the communication system.

8. The encoding method of claim 7, wherein the transform encoder comprises:

an outer transform encoder receiving the data container block v and generating an outer transform block u by computing $u=vG_{out}$; and an inner transform encoder receiving the outer transform block u and generating the transmitted code block x by computing $x=uG_{in}$.

9. The encoding method of claim 7, wherein the encoding method further comprises determining the data index set $\mathcal{A}$ by means of a score function, wherein the score function depends on the product $G_{out}G_{in}$ of the inner and outer transform matrices $G_{in}$ and $G_{out}$.

10. A decoding method for use in a communication system for decoding a received code block y using a decoder apparatus including an inner decoder and an outer decoder to generate a decoded source block $\hat{d}$ as an estimate of a source data block d, wherein the received code block y comprises a noisy version of a transmitted code block x, the decoding method comprising:

receiving the received code block y from an encoder via a channel in the communication system;

configuring the decoder apparatus according to a set of parameters (N, K, $G_{out}$, $G_{in}$, $\mathcal{A}$, a), wherein N is a length of the transmitted code block x, K is a length of the source data block d, wherein $G_{out}$ is an outer transform matrix and $G_{in}$ is an inner transform matrix, wherein $\mathcal{A}$ is a data index set, wherein a is a frozen data block, wherein N and K are integers that satisfy $1 \leq K < N$, wherein the data index set $\mathcal{A}$ is a subset of $\{1, 2, \ldots, N\}$ with a size $|\mathcal{A}|=K$, wherein the frozen data block a has a length $N-K$, wherein the outer transform matrix $G_{out}$ is an $N \times N$ upper-triangular Toeplitz matrix defined by a causal impulse response $c=(c_0, c_1, \ldots, c_{N-1})$, wherein $c_0 \neq 0$ and $c_m \neq 0$ for at least one integer m satisfying $1 \leq m \leq N-1$, wherein the inner transform matrix $G_{in}$ is a $N \times N$ lower-triangular polar transform matrix given by a Kronecker power $$G_{in} = \begin{bmatrix} 1 & 0 \\ 1 & 1 \end{bmatrix}^{\otimes n},$$

wherein $n=\log_2 N$, wherein the transmitted code block x is related to the source data block d by a relation $x=vG_{out}G_{in}$, wherein v is a data container block such that $v_\mathcal{A}=d$ and $v_{\mathcal{A}^c}=a$, wherein $v_\mathcal{A}$ denotes the part of v corresponding to the coordinates of v whose indices are in $\mathcal{A}$, and wherein $v_{\mathcal{A}^c}$ denotes the part of v corresponding to the coordinates of v whose indices are not in $\mathcal{A}$;

receiving, at the inner decoder, the received code block y;

sending node metric requests from the outer decoder to the inner decoder;

receiving, at the inner decoder, the node metric requests from the outer decoder;

calculating, in the inner decoder, node metrics in accordance with the inner transform matrix $G_{in}$;

sending calculated node metrics from the inner decoder to the outer decoder;

receiving, at the outer decoder, the calculated node metrics from the inner decoder;

calculating, in the outer decoder, a decoded data container block 19 in accordance with the outer transform matrix $G_{out}$, the data index set $\mathcal{A}$, and the frozen data block a;

extracting the decoded source data block $\hat{d}$ from a part $\hat{v}_{\mathcal{A}}$ of the decoded data container block $\hat{v}$, wherein $\hat{v}_{\mathcal{A}}$ denotes the part of $\hat{v}$ corresponding to the coordinates of $\hat{v}$ whose indices are in $\mathcal{A}$; and sending the decoded source data block $\hat{d}$ to a destination in the communication system.

11. The decoding method of claim 10, further comprising:
calculating, within the inner decoder, the node metrics in accordance with a successive cancellation decoder for polar codes.

12. The decoding method of claim 10, further comprising:
calculating, within the outer decoder, the decoded data container block P by using a tree search algorithm.

* * * * *